US008139402B2

(12) United States Patent
Tanizaki et al.

(10) Patent No.: US 8,139,402 B2
(45) Date of Patent: Mar. 20, 2012

(54) MAGNETIC MEMORY DEVICE

(75) Inventors: Hiroaki Tanizaki, Itami (JP); Shuichi Ueno, Tokyo (JP); Yasumitsu Murai, Itami (JP); Takaharu Tsuji, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 566 days.

(21) Appl. No.: 12/349,542

(22) Filed: Jan. 7, 2009

(65) Prior Publication Data

US 2009/0174016 A1 Jul. 9, 2009

(30) Foreign Application Priority Data

Jan. 8, 2008 (JP) ................... 2008-001311

(51) Int. Cl.
*G11C 11/14* (2006.01)
(52) U.S. Cl. .................... 365/158; 365/171; 365/173
(58) Field of Classification Search .............. 365/55, 365/66
See application file for complete search history.

(56) References Cited

U.S. PATENT DOCUMENTS

| | | | |
|---|---|---|---|
| 6,760,251 B2 * | 7/2004 | Hidaka .......................... | 365/171 |
| 6,798,691 B1 | 9/2004 | Ounadjela et al. | |
| 6,862,209 B2 * | 3/2005 | Hidaka et al. ................. | 365/158 |
| 6,934,130 B2 | 8/2005 | Ikarashi | |
| 7,369,429 B2 * | 5/2008 | Tanizaki ....................... | 365/158 |
| 2004/0246777 A1 | 12/2004 | Maejima et al. | |

FOREIGN PATENT DOCUMENTS

| JP | 2003-78112 A | 3/2003 |
|---|---|---|
| JP | 2004-296858 A | 10/2004 |
| JP | 2004-296859 A | 10/2004 |
| JP | 2006-294179 A | 10/2006 |

* cited by examiner

*Primary Examiner* — Tan T. Nguyen
(74) *Attorney, Agent, or Firm* — Miles & Stockbridge P.C.

(57) ABSTRACT

A magnetic memory device is provided in which, even when a recording layer having an asymmetric shape and a local via are formed over a strap wiring with a sufficient distance allowed therebetween, increase in the size of the magnetic memory device can be suppressed. The magnetic memory device includes the strap wiring, the local via, and a magnetic recording element (TMR element). The TMR element includes a fixed layer and the recording layer. The planar shape of the recording layer is asymmetric with respect to the direction of the easy magnetization axis of the recording layer and is symmetric with respect to the axis of symmetry perpendicular to the easy magnetization axis. The contoured portion of the recording layer on the side closer to the center of area of the recording layer is opposed to the local via formation side.

29 Claims, 18 Drawing Sheets

CONSTANT AT WIDTH OF 0.1 μm OR ABOVE

MAGNETIC MEMORY DEVICE

CROSS-REFERENCE TO RELATED APPLICATIONS

The disclosure of Japanese Patent Application No. 2008-1311 filed on Jan. 8, 2008 including the specification, drawings and abstract is incorporated herein by reference in its entirety.

BACKGROUND OF THE INVENTION

The present invention relates to magnetic memory devices and is applicable to magnetic memory devices capable of storing data by giant magneto-resistive effect or tunneling magneto-resistive effect.

Studies have been conducted on nonvolatile magnetic storage semiconductor devices (MRAM: Magnetic Random Access Memory) utilizing the tunneling magneto-resistive (TMR: Tunneling Magneto-Resistive) effect by ferromagnetic tunnel junction. An example of prior literature on the TMR element is Patent Document 1. In this specification, the term of TMR element is used as a concept including MTJ (Magnetic Tunnel Junction) element.

The TMR element disclosed in Patent Document 1 has a three layered laminated structure of fixed layer/insulating layer/free layer. In the magnetic memory device disclosed in Patent Document 1, a current is passed through a selection bit line (selection BL) and a selection digit line (selection DL). Thus a combined magnetic field is produced at the intersection between the selection BL and the selection DL and the orientation of magnetization of the free layer composing a TMR element can be changed (writing of data). By passing a current through a TMR element and detecting the resistance value thereof, reading of data is executed. The resistance value of the TMR element varies depending on whether the orientation of magnetization in the fixed layer and that in the free layer are identical or opposite.

In the MRAM according to Patent Document 1, the write characteristic is improved by specifying the shape of the TMR element. The shape of this TMR element is asymmetric in the direction of an axis on which magnetization is easy and symmetric with respect to an axis perpendicular to the axis on which magnetization is easy. (Hereafter, the shape of the TMR element is simply referred to as asymmetric shape.)

The above MRAM is comprised of an element selection transistor and a TMR element having the above asymmetric shape. In the above MRAM, the TMR element is arranged between a bit line (BL) extended in a first direction and a digit line (DL) intersecting the BL as viewed on a plane. The TMR element is formed over a strap wiring (also referred to as local strap (LS)). In addition, the above MRAM includes a top via (TV) for coupling a TMR element and BL and a local via (LV) for coupling LS and either electrode area of an element selection transistor. These vias are required to read data. The other electrode area of the element selection transistor has a source line (SL) coupled thereto. The gate electrode of the element selection transistor becomes a word line (WL). The SL and the WL are also required to read data.

The other prior literature related to the MRAM includes Patent Document 2. Patent Document 2 proposes a cell structure comprised of one element selection transistor and four TMR elements.

[Patent Document 1]
Japanese Unexamined Patent Publication No. 2004-296858
[Patent Document 2]
Japanese Unexamined Patent Publication No. 2006-294179

SUMMARY OF THE INVENTION

Both in the technique according to Patent Document 1 and in the technique according to Patent Document 2, LV need be coupled to the under surface of LS. However, it is difficult to finish flat the principal surface of LS with LV coupled thereto in terms of process. Specifically, a depressed portion is formed in the top surface of LS in proximity to the joint with LV because of the junction with the LV.

When a TMR element, also formed over the principal surface of LS, is influenced by the depressed portion in the top surface of the LS, variation is produced in write characteristic with respect to the TMR element. Therefore, it is required to allow a sufficient distance between LV and a TMR element in LS as viewed on a plane.

Since the memory cell size of MRAM is larger than NOR and the like of flash memory, it is required to reduce the memory cell size as much as possible. However, when a sufficient distance is allowed between LV and a TMR element, as mentioned above, the size of a memory cell (magnetic memory device) is increased.

To cope with this, it is an object of the invention to provide a magnetic memory device wherein, even when a TMR element having the above-mentioned asymmetric shape and LV are formed over LS with a sufficient distance allowed therebetween, increase in the size of the magnetic memory device can be suppressed.

In an embodiment of the invention, the following is implemented with respect to the planar shape of a recording layer: it is asymmetric in the direction of an axis on which magnetization is easy in the recording layer and it is symmetric with respect to an axis of symmetry perpendicular to the axis on which magnetization is easy. The contoured portion of the recording layer on the side closer to the center of area in the recording layer is opposed to the contact via (local via) formation side.

According to the above embodiment, the following can be implemented: even when a recording layer having an asymmetric shape and a local via are formed over a strap wiring with a sufficient distance allowed therebetween, it is possible to suppress increase in the occupied area of the strap wiring. Therefore, it is possible to suppress increase in the size of a magnetic memory device.

DETAILED DESCRIPTION OF THE PREFERRED EMBODIMENTS

First, description will be given to a configurative portion on which the invention is based.

Figure 1:
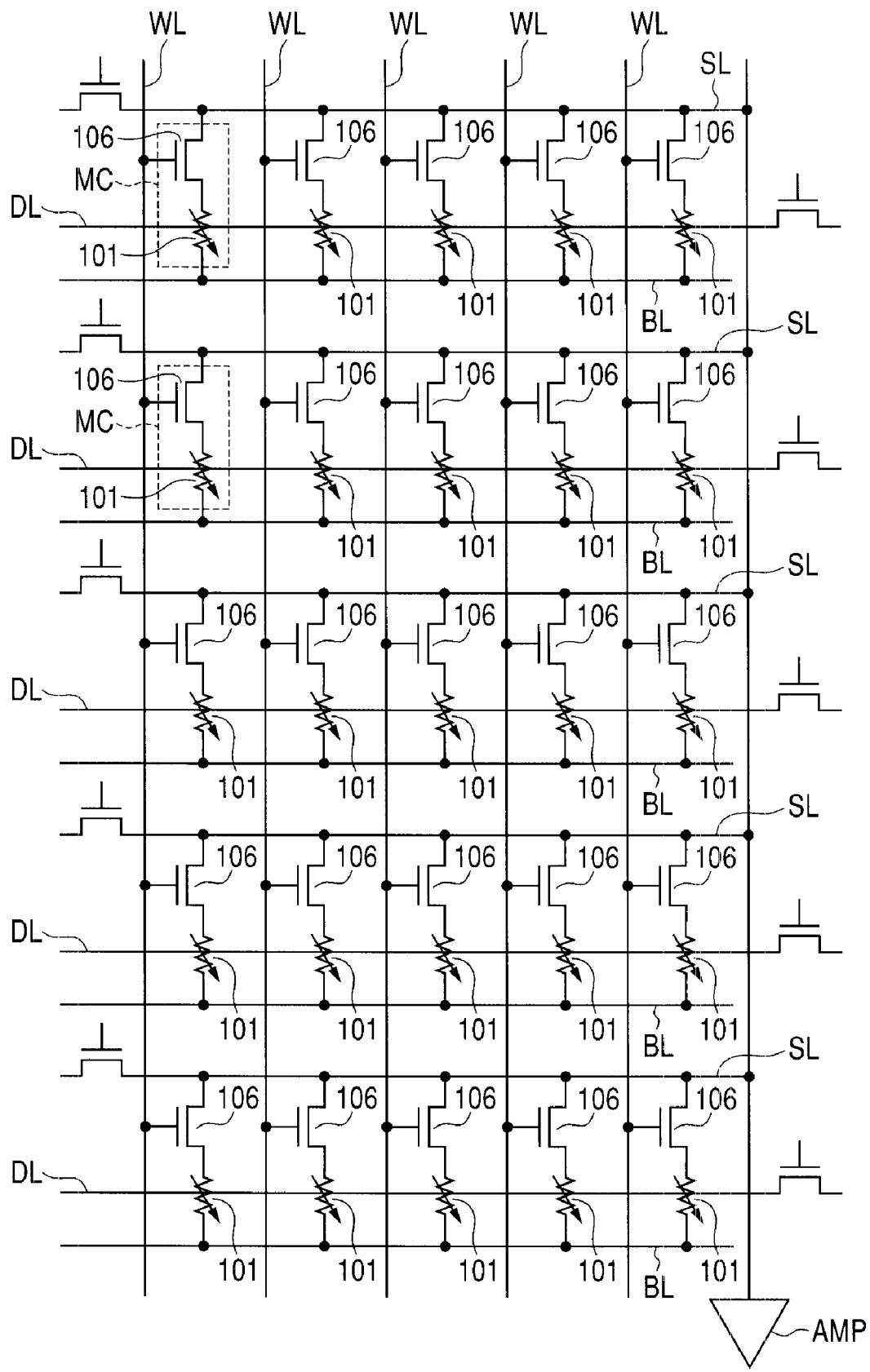
FIG. 1 is a circuit diagram illustrating the configuration of a magnetic memory device having a magnetic recording element.

FIG. 1 is a circuit diagram illustrating the configuration of a magnetic memory device (hereafter, referred to as MRAM: Magnetic Random Access Memory) having a magnetic recording element (hereafter, referred to as TMR: Tunneling Magneto-Resistive).

Multiple sets of a bit line BL, a source line SL, and a digit line DL are extended in the horizontal direction in FIG. 1. These sets are arranged in the vertical direction. Word lines WL intersecting these sets are extended in the vertical direction in FIG. 1. The word lines WL are arranged in the horizontal direction. The source lines SL are coupled to the input end of a sense amplifier AMP in common.

Each MRAM memory cell MC is provided in an area encircled with a bit line BL, a source line SL, and word lines WL. As illustrated in FIG. 1, the MRAM memory cells MC are arranged in a matrix pattern. Each MRAM memory cell MC includes series coupling of an element selection transistor 106 and a TMR element 101 as a ferromagnetic tunnel junction element. More specifically, each TMR element 101 is arranged at the intersection between a digit line DL and a bit line BL.

Figure 2:
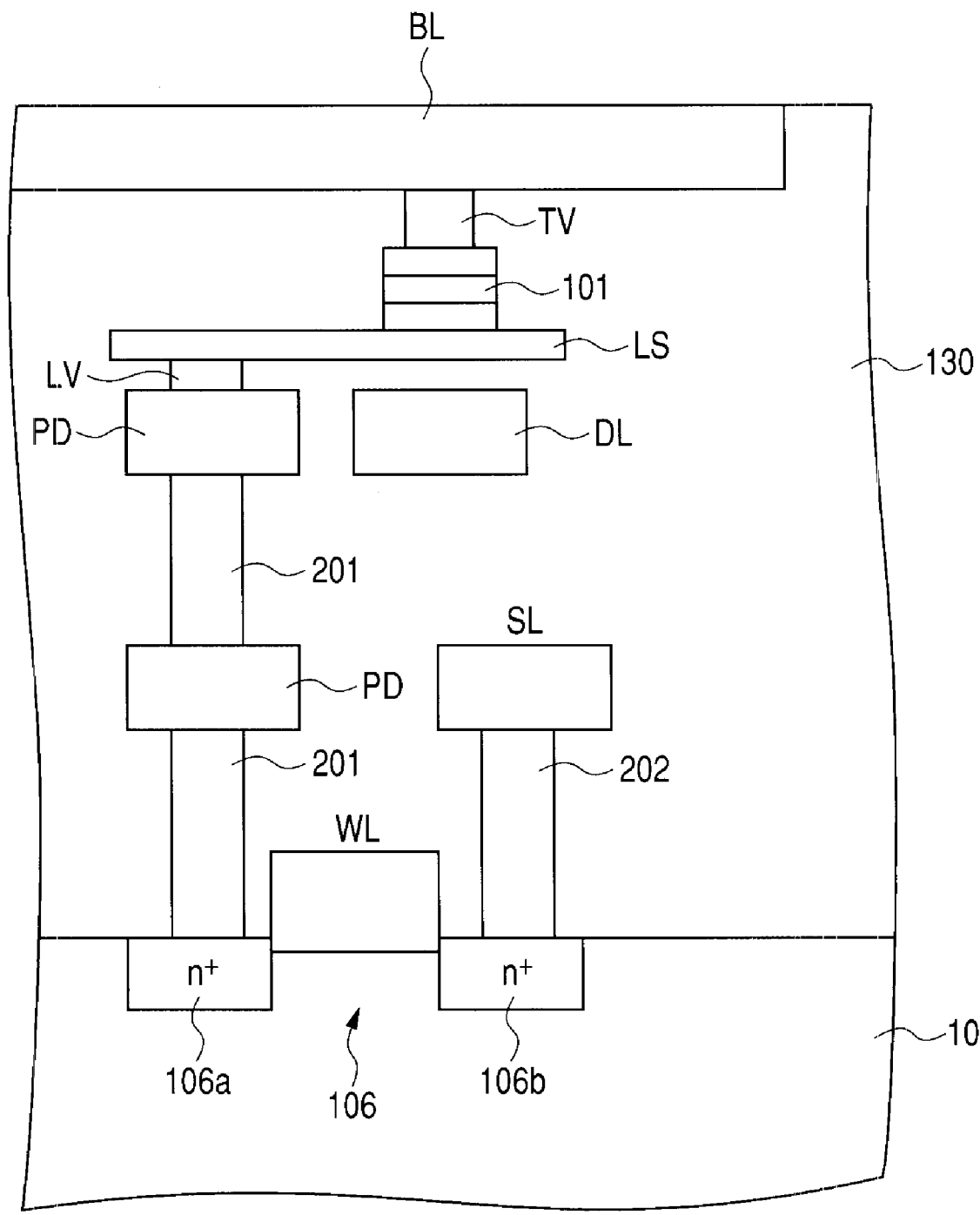
FIG. 2 is a schematic sectional view illustrating the configuration of one memory cell.

FIG. 2 is a schematic sectional view illustrating the configuration of one MRAM memory cell MC.

In the top surface of a semiconductor substrate 10, an element selection transistor 106 is formed. Over the semiconductor substrate 10, an interlayer insulating film 130 is formed. In the interlayer insulating film 130, the following are disposed: a word line WL, contact vias 201, 202, a source line SL, pad electrodes PD, a digit line DL, a local via LV, a strap wiring LS, a TMR element 101, a top via TV, a bit line BL, and the like. In the surface of the semiconductor substrate 10, source and drain impurity diffusion layers 106a, 106b are formed.

The word line WL functions as the gate electrode of the element selection transistor 106. Though omitted in FIG. 2, the gate structure including the gate electrode is a laminated structure obtained by forming a gate insulating film and a gate electrode layer in this order. On both the side faces of the gate structure, a side wall film is formed. The drain 106a of the element selection transistor 106 is coupled to the TMR element 101 through the contact plugs 201, pad electrodes PD, local via LV, and strap wiring (also referred to as local strap) LS. The source 106b of the element selection transistor 106 is coupled to the source line SL through the contact plug 202.

A local via LV of stacked via structure that does not have a pad electrode PD may be adopted.

Between the strap wiring LS and the semiconductor substrate 10, the digit line DL is placed so that it is insulated through the interlayer insulating film 130. The TMR element 101 and the bit line BL are electrically coupled together through the top via (contact via) TV. As illustrated in FIG. 2, the upper part of the local via LV is coupled to the under surface side of the strap wiring LS. That is, the strap wiring LS and portions (for example, the drain 106a) positioned under the strap wiring LS are electrically coupled together through the local via (contact via) LV. Meanwhile, the top surface side of the strap wiring LS is coupled with the under surface of the TMR element 101.

Figure 3A:
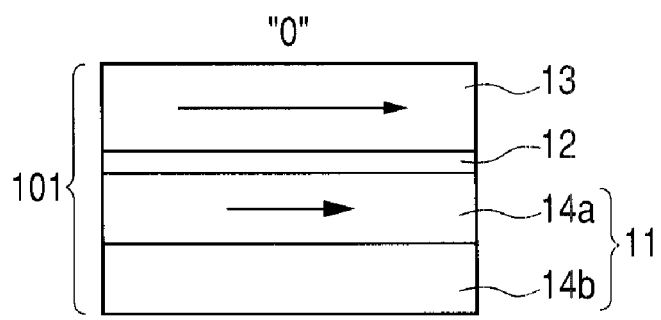
FIGS. 3(a) and 3(b) are sectional views illustrating the detailed structure of a TMR element.
Figure 3B:
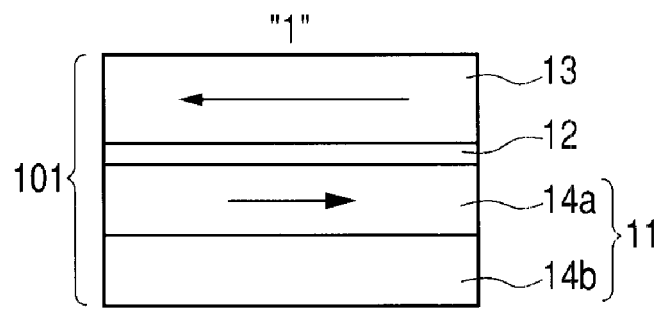

FIGS. 3(a) and 3(b) are sectional views illustrating the structure of a TMR element 101 in detail. The TMR element 101 has such a structure that a fixed layer (pin layer) 11, a tunnel insulating layer 12, and a recording layer (free layer) 13 are laminated in this order from the semiconductor substrate 10 side.

Magnetization of the fixed layer 11 is fixed beforehand in a predetermined direction, for example, the direction in which the digit lines DL are extended. The direction of magnetization of the recording layer 13 is changed by an external magnetic field. The state illustrated by sketch of FIG. 3(a) is taken as the state in which the TMR element 101 stores "0." That is, the state in which the direction of magnetization of the fixed layer 11 and the direction of magnetization of the recording layer 13 agree with each other is taken as the state in which the TMR element 101 stores "0." The state illustrated by sketch of FIG. 3(b) is taken as the state in which the TMR element 101 stores "1." That is, the state in which the direction of magnetization of the fixed layer 11 and the direction of magnetization of the recording layer 13 are opposite to each other is taken as the state in which the TMR element 101 stores "1."

The fixed layer 11 is of laminated structure and includes, for example, an antiferromagnetic layer 14b and a ferromagnetic layer 14a. Adoption of this laminated structure makes it possible to fix the direction of magnetization in the fixed layer 11. That is, the antiferromagnetic layer 14b fixes the orientation of spin of the ferromagnetic layer 14a and thereby fixes the direction of magnetization of the ferromagnetic layer 14a. The antiferromagnetic layer 14b is provided under the ferromagnetic layer 14a (that is, on the opposite side to the recording layer 13 with the tunnel insulating layer 12 in-between). For example, CoFe can be adopted for the ferromagnetic layer 14a. Meanwhile, for example, IrMn can be adopted for the antiferromagnetic layer 14b.

The recording layer 13 is a ferromagnetic layer and of laminated structure and includes, for example, a CoFe layer and a NiFe layer. For example, AlOx or MgO can be adopted for the tunnel insulating layer 12. In general, ferromagnetic bodies has a direction in which it is easily magnetized (a state in which energy is low) depending on crystal structure, shape, or the like. The direction in which magnetization is easy to achieve is designated as easy magnetization axis (easy axis). Meanwhile, the direction in which magnetization is hard to achieve is designated as hard magnetization axis (hard axis). In the configuration illustrated in FIG. 2, the easy magnetization axis and the hard magnetization axis of the recording layer 13 are respectively set in the direction in which the digit line DL is extended and the direction in which the bit line BL is extended.

The TMR element 101 (especially, the recording layer 13) has the shape described below as viewed on a plane from the viewpoint of write characteristic enhancement. (Refer to Japanese Unexamined Patent Publication No. 2004-296858, for example.) The planar shape of the TMR element 101 (recording layer 13) is such that: it is asymmetric with respect to the direction of the easy magnetization axis of the recording layer 13 and is symmetric with respect to the axis of symmetry perpendicular to the easy magnetization axis. (This axis of symmetry can also be grasped as the direction of the hard magnetization axis.) (The above shape will be simply referred to as asymmetric shape.) The asymmetric shape of the recording layer 13 will be described in detail in relation to the following embodiments.

The tunnel insulating layer 12 and the fixed layer 11 are identical in shape with the recording layer 13 or may have a larger area than the recording layer 13 with the shape of the recording layer 13 included. The fixed layer 11 is electrically coupled with the strap wiring LS through a lower electrode (a conductive film composed of, for example, Ta, not shown). Meanwhile, the recording layer 13 is electrically coupled to the bit line BL through the top via TV electrically coupled with an upper electrode (a conductive film composed of, for example, Ta, not shown) positioned thereabove.

Description will be given to write operation to a TMR element 101.

First, a current is passed through the bit line BL and the digit line DL. When a current is passed through the bit line BL, a magnetic field is produced in the direction encircling the bit line BL. A first magnetic field in the direction of the easy magnetization axis is applied to the recording layer 13 positioned under the bit line BL by this magnetic field. Meanwhile, when a current is passed through the digit line DL, a magnetic field is produced in the direction encircling the digit line DL. A second magnetic field in the direction of the hard magnetization axis is applied to the recording layer 13 positioned above the digit line DL by this magnetic field. In write operation, therefore, a combined magnetic field of the first magnetic field and the second magnetic field is applied to the recording layer 13.

The magnitude of a magnetic field required for inverting the orientation of magnetization of the recording layer 13 takes an astroid curve. For example, when the value of the above combined magnetic field exceeds the astroid curve, the recording layer 13 is magnetized in the direction of the easy magnetization axis.

When the fixed layer 11 is magnetized beforehand in the same direction as the first magnetic field, in the TMR element 101, the direction of magnetization of the fixed layer 11 and that of the recording layer 13 are parallel with each other. (This is a state illustrated by sketch of FIG. 3(a) and "0" is stored.) In this case, the resistance value is reduced with respect to the direction of the thickness of the TMR element 101 (the direction in which the recording layer 13 and the fixed layer 11 are laminated).

When the fixed layer 11 is magnetized beforehand in the opposite direction to the first magnetic field, in the TMR element 101, the direction of magnetization of the fixed layer 11 and that of the recording layer 13 are antiparallel with each other. (This is a state illustrated by sketch of FIG. 3(b) and "1" is stored.)

Description will be given to read operation.

In read operation, a predetermined word line WL is selected and driven and an element selection transistor 106 coupled to the word line WL is thereby turned on. Further, by passing a current through a predetermined bit line BL, a tunnel current is passed through the TMR element 101 coupled to the element selection transistor 106 in one state. At this time, the state of storage is determined based on the resistance of the TMR element 101.

More specific description will be given. The TMR element 101 has such a property that its resistance is low when the directions of magnetization are parallel and its resistance is high when the directions of magnetization are antiparallel. This property is utilized by the sense amplifier AMP to detect whether the output signal of a selected memory cell is larger than the output signal of a reference cell. Thus the state of storage of the selected memory cell, that is, whether "0" is stored or "1" is stored, is determined.

Concrete description will be given to the arrangement relation between a TMR element 101 including a recording layer 13 having the above-mentioned asymmetric shape and a local via LV formed in a strap wiring LS in the following embodiments. The description will be given with reference to the drawings.

First Embodiment

Figure 4:
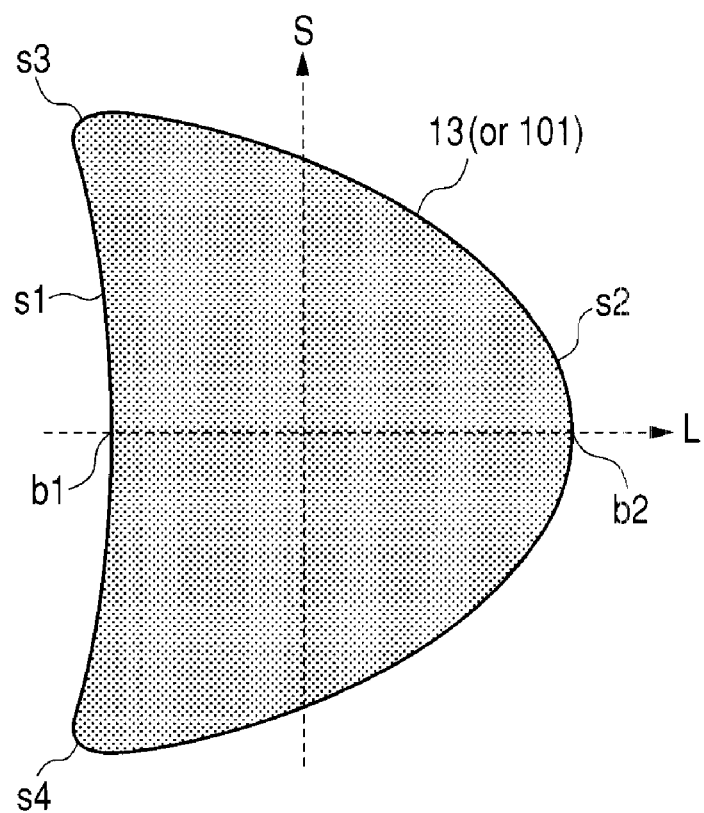
FIG. 4 is a plan view illustrating the asymmetric shape of a recording layer or a TMR element in a first embodiment.

In this embodiment, each TMR element 101 (or each recording layer 13) has the asymmetric shape illustrated in FIG. 4 as viewed on a plane. That is, at least each recording layer 13 has the asymmetric shape illustrated in FIG. 4. The following description is on the assumption that the planar shape of the entire TMR element 101 is this asymmetric shape.

As illustrated in FIG. 4, the TMR element 101 is asymmetric with respect to the easy magnetization axis S. It has the symmetric property with respect to the axis of symmetry (that can be understood as the direction of hard magnetization axis) L perpendicular to the easy magnetization axis S. The shape illustrated in FIG. 4 can be understood as crescent shape or fava bean shape. That is, in the asymmetric shape illustrated in FIG. 4 as an example, one contoured portion s1 of the TMR element 101 opposed to the easy magnetization axis S has such an outline that the following is implemented: it is concave inward of the TMR element 101 (to the right side of FIG. 4). The other contoured portion s2 of the TMR element 101 opposed to the easy magnetization axis S has such an outline that it is convex outward of the TMR element 101 (to the right side of FIG. 4).

Both the one contoured portion s1 and the other contoured portion s2 have fragmentary portions b1, b2 positioned on the axis of symmetry L. Both the tangential line at the fragmentary portion b1 and the tangential line at the fragmentary portion b2 are parallel with the direction of the easy magnetization axis S.

Specifically, the asymmetric shape (fava bean shape) illustrated in FIG. 4 has four different arcs s1 to s4. The arc s1, arc s4, arc s2, arc s3, and arc s1 are coupled in this order to form a closed curve. In place of the configuration in FIG. 4, an asymmetric shape (crescent shape) without the arc s3 or the arc s4 may be adopted. In the crescent shape, the ends of the arc s1 and the arc s2 acutely interest each other at the arc s3 or s4.

The arc (one contoured portion) s1 is an arc defined by a first curvature. The arc (the other contoured portion) s2 is an arc defined by a second curvature. In this example, the second curvature is larger than the first curvature. Both the arc s3 and the arc s4 are arcs defined by a third curvature. The third curvature has a value different from those of the first curvature and the second curvature.

Figure 5:
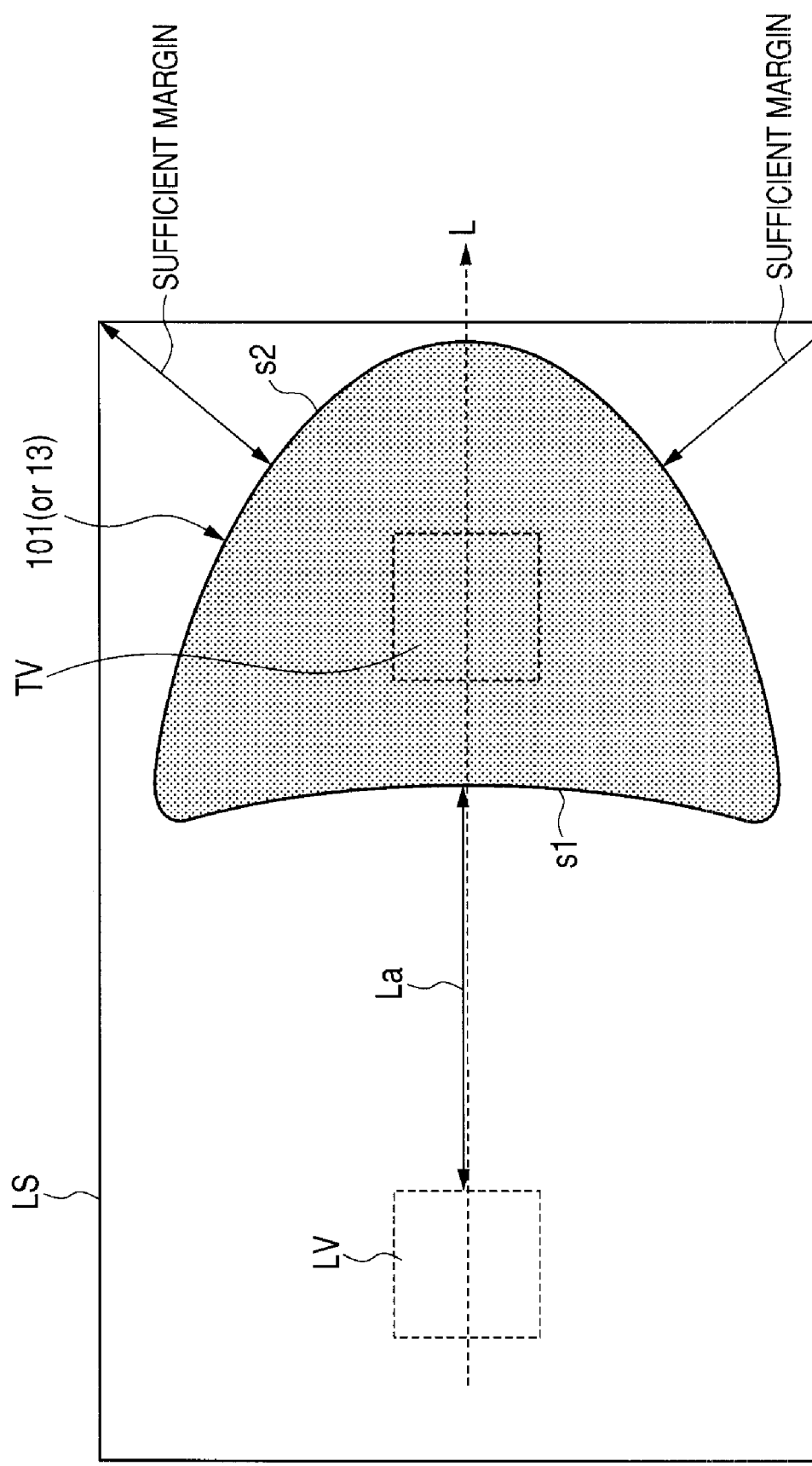
FIG. 5 is a plan view illustrating the arrangement relation between a local via and a TMR element in the first embodiment.

FIG. 5 is a plan view illustrating the arrangement relation between a TMR element 101 and a local via LV formed in a strap wiring LS. The entire TMR element 101 (or at least the recording layer 13) illustrated in FIG. 5 has the asymmetric shape (fava bean shape or crescent shape) illustrated in FIG. 4. (This is the same with FIGS. 12 to 15 referred to later.) The following description with reference to FIG. 5 and FIGS. 12 to 15 is on the assumption that the entire TMR element 101 has the asymmetric shape illustrated in FIG. 4 for the purpose of the simplification of description.

As illustrated in FIG. 5, the one contoured portion (arc) s1 having the above-mentioned concave outline as viewed on a plane is opposed to the local via (that can be grasped as contact via) LV formation side. In other words, the other contoured portion (arc) s2 having the convex outline is not opposed to the local via LV formation side.

In the asymmetric shape illustrated in FIG. 4, the barycenter (center of area) exists on the axis of symmetry L and is positioned closer to the arc s1 than to the arc s2. The center of area cited here refers to the center of mass of a predetermined plane when the mass is evenly distributed in the plane. In the configuration in FIG. 5, therefore, the contoured portion (arc) s1 of the recording layer 13 on the side closer to the center of area of the recording layer 13 is opposed to the local via LV formation side.

The planar shape of the strap wiring LS is substantially rectangular. The local via LV and the TMR element 101 are arranged alongside in the direction of the length of the strap wiring LS as viewed on a plane.

Figure 6:
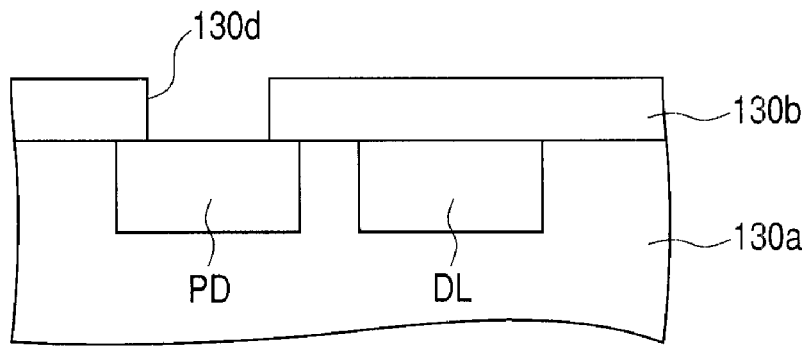
FIG. 6 is a process sectional view for explaining that a depressed portion is formed in a strap wiring.

The TMR element 101 and the local via LV formed in the strap wiring LS are so arranged that they are away from each other by a predetermined distance La as viewed on a plane. The reason why the TMR element 101 and the local via LV are formed at a distance from each other is as follow:

As illustrated in FIG. 6, for example, a configuration in which a digit line DL and a pad electrode PD are placed in an interlayer insulating film 130a is formed. As illustrated in FIG. 6, thereafter, an interlayer insulating film 130b is formed over the interlayer insulating film 130a. An opening 130d exposing the pad electrode PD is formed in the interlayer insulating film 130b.

Figure 7:
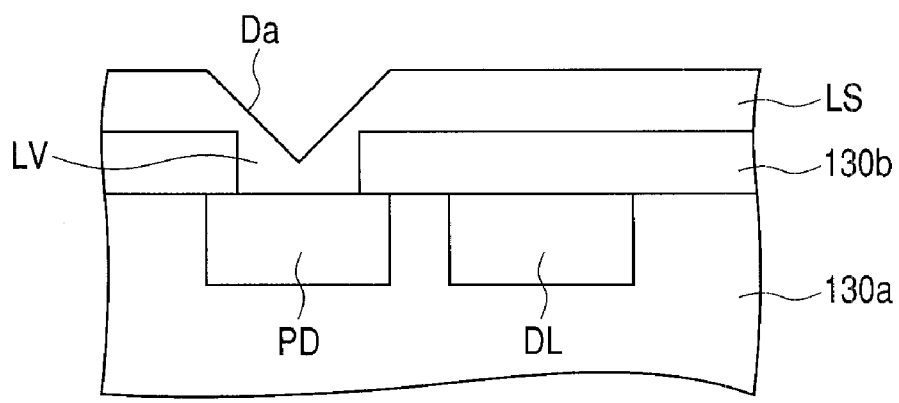
FIG. 7 is a process sectional view for explaining that a depressed portion is formed in a strap wiring.

As illustrated in FIG. 7, thereafter, a strap wiring LS is formed over the interlayer insulating film 130b so that part of the opening 130d is filled therewith. As the result of the formation of the strap wiring LS, a local via LV coupled with the pad electrode PD is formed in the opening 130d. That is, in this manufacturing method, part of the strap wiring LS comprises the local via LV. As the result of the formation of the strap wiring LS and the local via LV, a depressed portion Da is formed over the strap wiring LS due to the opening 130d.

Figure 8:
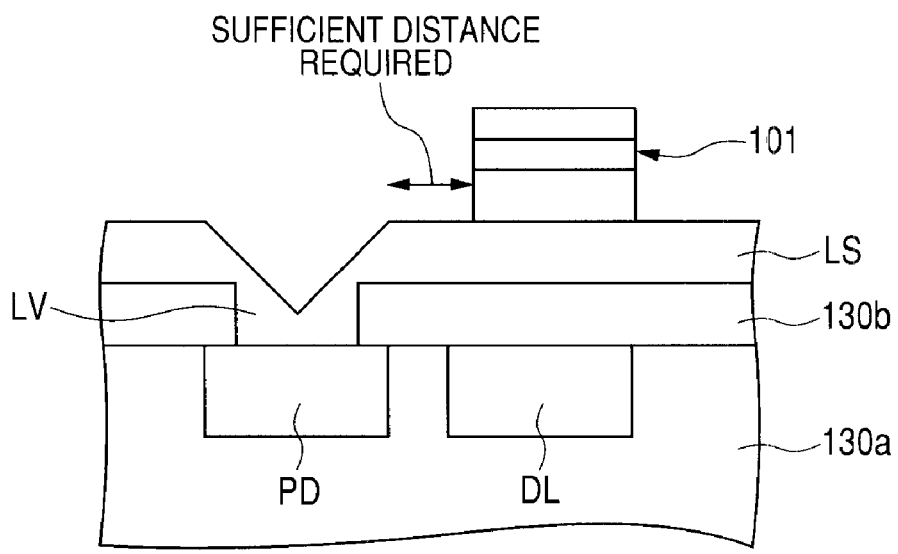
FIG. 8 is a process sectional view for explaining that a depressed portion is formed in a strap wiring.

When a TMR element 101 is formed in and in proximity to the depressed portion Da, variation is produced in the write characteristic of the TMR element 101. To cope with this, it is required to take the measure illustrated in FIG. 8. That is, it is required to form the TMR element 101 at a sufficient distance from the depressed portion Da (in other words, the local via LV) when the TMR element 101 is formed over the strap wiring LS.

Also when the following method is adopted, it is required to form the TMR element 101 at a sufficient distance from the local via LV when the TMR element 101 is formed over the strap wiring LS.

Figure 9:
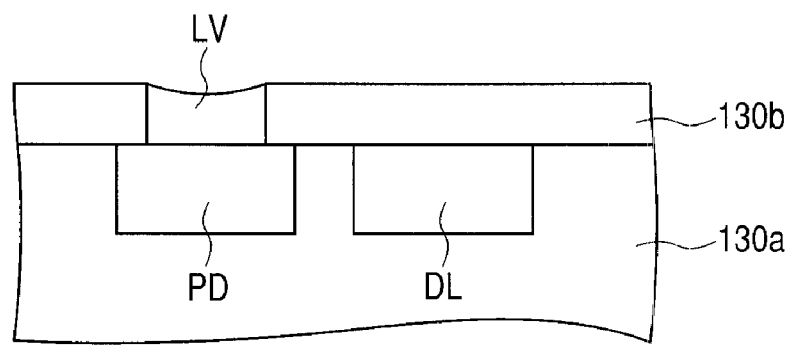
FIG. 9 is a process sectional view for explaining that a depressed portion is formed in a strap wiring.
Figure 10:
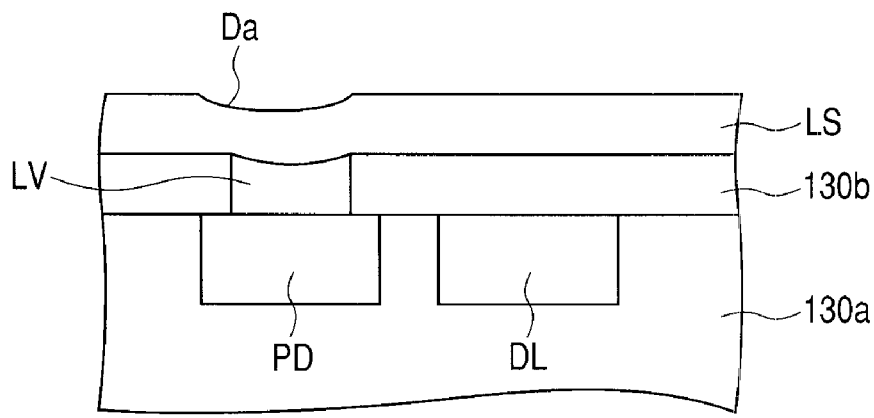
FIG. 10 is a process sectional view for explaining that a depressed portion is formed in a strap wiring.

To reduce the influence of the depressed portion Da, consequently, the following processing is carried out after the configuration in FIG. 6 is formed: after a conductive film of, for example, W or Cu is so formed that the opening 130d is filled, CMP (Chemical Mechanical Polishing) is carried out. The local via LV is thereby formed in the opening 130d. (Refer to FIG. 9.) The strap wiring LS is formed over the interlayer insulating film 130b. (Refer to FIG. 10.) As illustrated in FIG. 10, the depressed portion Da is formed in the top surface of the strap wiring LS above the local via LV due to the above CMP.

Figure 11:
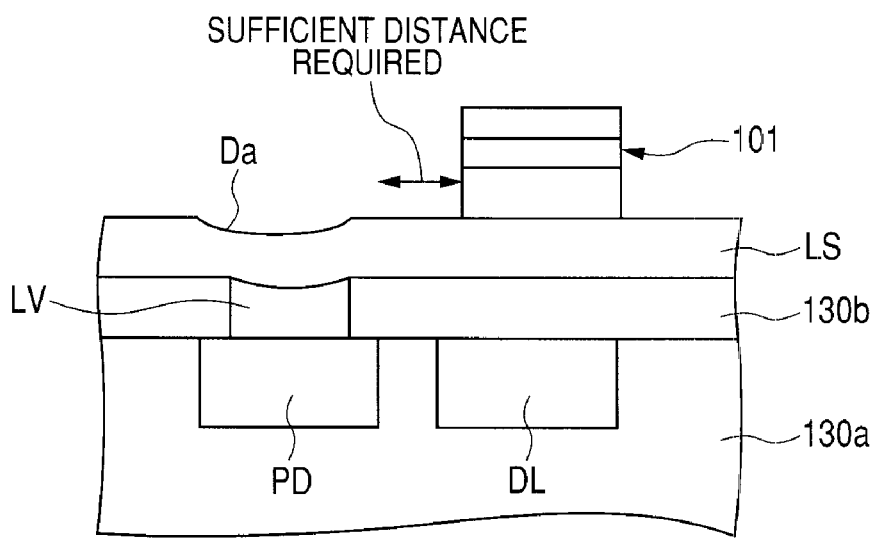
FIG. 11 is a process sectional view for explaining that a depressed portion is formed in a strap wiring.

Also in the latter method, therefore, it is required to consider the prevention of degradation in the write characteristic of the TMR element 101 due to the depressed portion Da. As illustrated in FIG. 11, therefore, it is required to form the TMR element 101 at a sufficient distance from the depressed portion Da (in other words, the local via LV) over the strap wiring LS.

In this embodiment, as mentioned above, the TMR element 101 having the asymmetric shape illustrated in FIG. 4 is arranged over the strap wiring LS so that the arc s1 side thereof is opposed to the local via LV. (Refer to FIG. 5.) In other words, the contoured portion (arc) s1 of the TMR element 101 on the side closer to the barycenter (center of area) of the TMR element 101 is opposed to the local via LV formation side. (Refer to FIG. 5.)

Thus the following can be implemented even when the TMR element 101 and the local via LV are formed over the strap wiring LS with a sufficient distance allowed therebetween: increase in the size of the magnetic memory device (memory cell) can be suppressed. Specific description will be given.

In the top surface (the surface on the TMR element 101 formation side) of the strap wiring LS, a depressed portion is formed due to the formation of the local via LV. To reduce the influence of the depressed portion on the recording layer 13, it is required to form the recording layer 13 (TMR element 101) away from the local via LV by a sufficient distance La over the strap wiring LS. (Refer to FIG. 5.)

Figure 12:
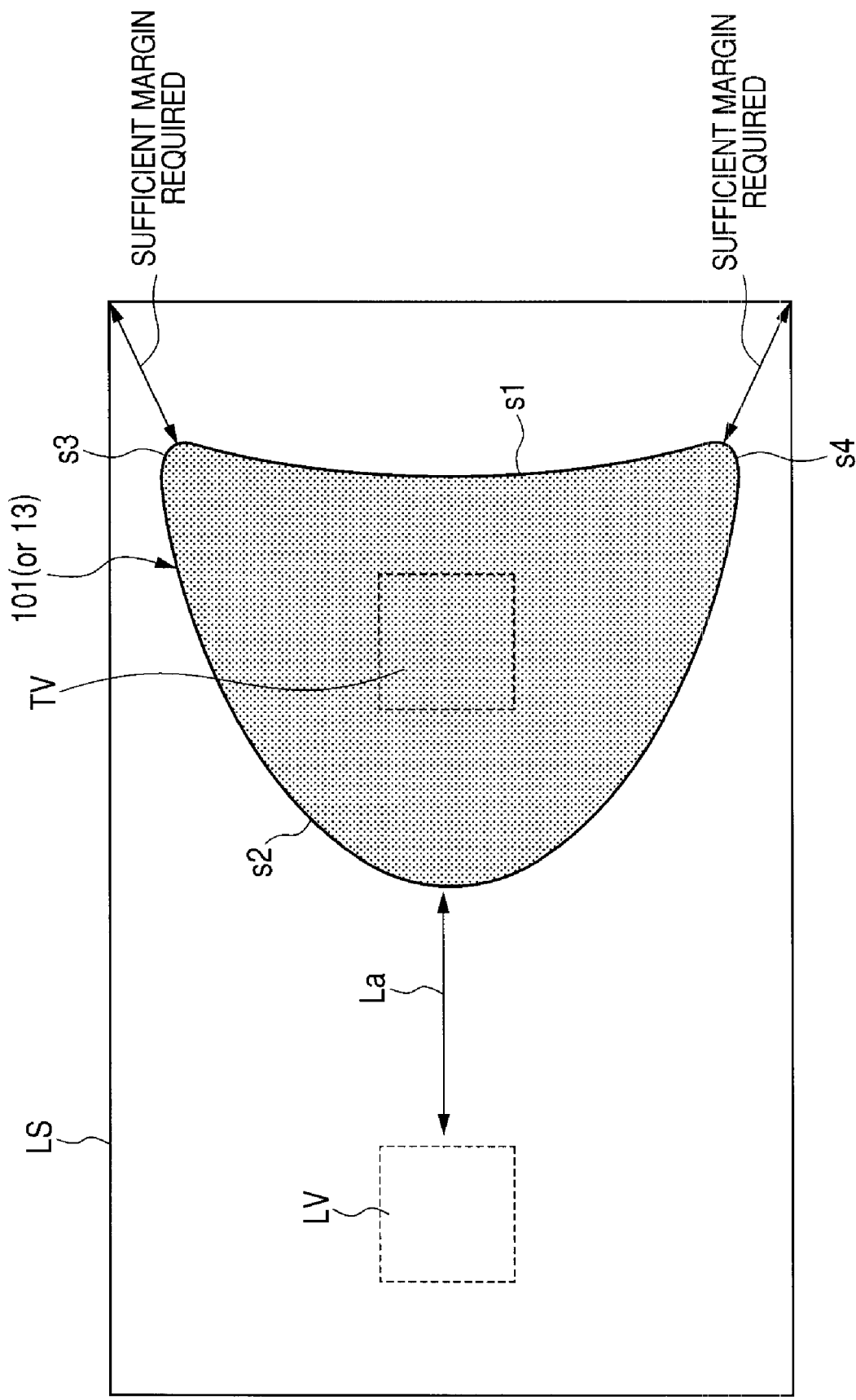
FIG. 12 is a plan view for explaining the effect of a configuration in the first embodiment.

In this embodiment, the concave contoured portion (arc) s1 is opposed to the local via LV. Therefore, the area of the strap wiring LS can be reduced more than when the convex contoured portion (arc s2) is opposed to the local via LV as illustrated in FIG. 12,. This is because, when the strap wiring LS is formed by etching, a predetermined margin is required between a corner of the strap wiring LS and the TMR element 101.

Both in the example in FIG. 5 and in the example in FIG. 12, the TMR element 101 is formed away from the local via LV by a distance La. In case of the configuration in FIG. 5, a sufficient distance can be allowed between a corner of the strap wiring LS and the TMR element 101. Therefore, it is possible to position the end side of the strap wiring LS on the TMR element 101 formation side closer to the TMR element 101. In case of the configuration in FIG. 12, meanwhile, the arcs s3, s4 of the TMR element 101 (recording layer 13) are protruded toward the end side of the strap wiring LS. Therefore, to allow a sufficient distance between a corner of the strap wiring LS and the TMR element 101, it is required to position the end side of the strap wiring LS on the TMR element 101 formation side farther away from the TMR element 101.

As seen from the above comparison, the area of the strap wiring LS can be reduced more with the configuration in FIG. 5. As the result of reduction of the area of the strap wiring LS, it is possible to suppress increase in the size of the magnetic memory device (memory cell).

As mentioned above, a sufficient distance is allowed between the TMR element 101 and the local via LV over the strap wiring LS. Therefore, it is possible to suppress the influence of the depressed portion, formed over the strap wiring LS due to the formation of the local via LV, on the TMR element 101. Thus it is possible to suppress variation in the write characteristic of the TMR element 101 due to the influence of the depressed portion.

It is difficult to form such a shape having an acute angle as a crescent shape by one step of lithography. However, the asymmetric shape illustrated in FIG. 4 can be easily formed by only one step of lithography when such an asymmetric shape having arcs s3, s4 in place of an acute angle as illustrated in FIG. 4.

The planar shape of the strap wiring LS is substantially rectangular. The local via LV and the TMR element 101 are arranged alongside in the direction of the length of the strap wiring LS as viewed on a plane. (Refer to FIG. 5.)

Therefore, it is possible to reduce the distance between cells adjoining in the direction of the digit lines and efficiently dispose the strap wirings LS.

Figure 13:
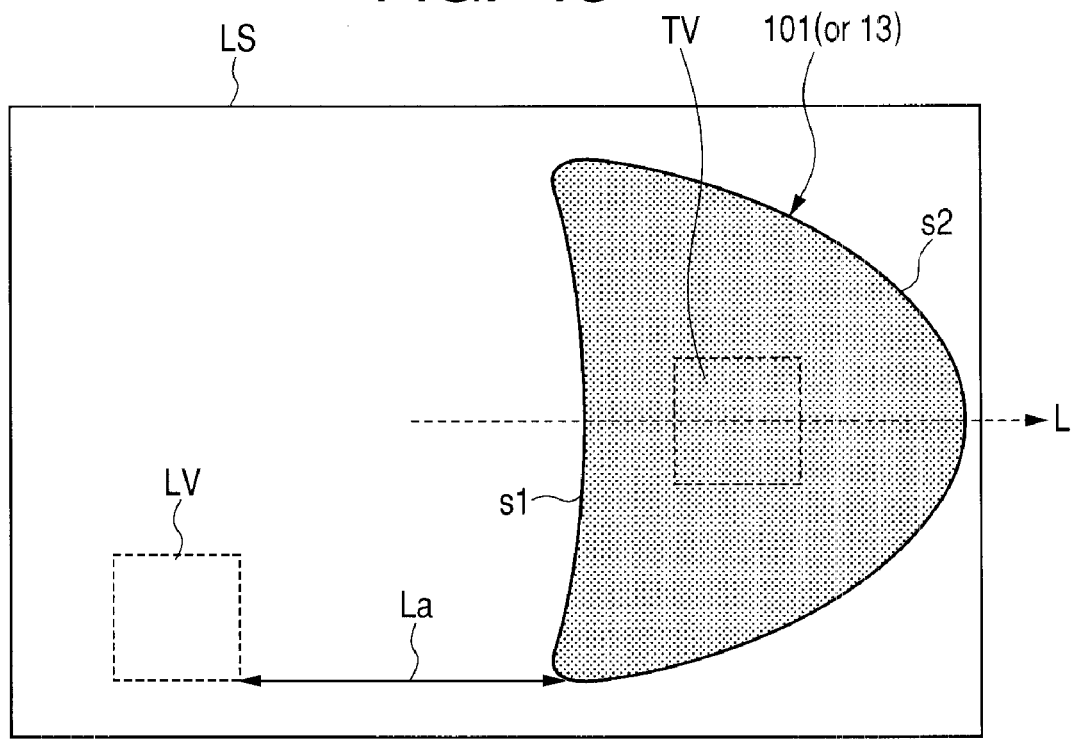
FIG. 13 is a plan view illustrating a configuration in which a local via is not formed on the extended line of an axis of symmetry.

As illustrated in FIG. 13, the local via LV may be shifted from the axis of symmetry L of the asymmetric shape and be formed on the under surface of the strap wiring. However, it is more desirable that the local via LV should be arranged on the extended line of the axis of symmetry L of the asymmetric shape as viewed on a plane as illustrated in FIG. 5.

The reason for this is as follows: even when a predetermined distance La is allowed between the local via LV and the TMR element 101 having the asymmetric shape, the local via LV can be positioned closer to the inside of the TMR element 101 with the configuration illustrated in FIG. 5. With the configuration in FIG. 5, therefore, it is possible to reduce the above distance in the direction of the length of the strap wiring LS. That is, with the configuration in FIG. 5, it is possible to reduce the area of the strap wiring LS more. The corners of the strap wiring LS on the local via LV side are also rounded by etching. For this reason, the following can be implemented by disposing the local via LV in the center of the strap wiring LS in the direction of the short sides thereof: even though etching misalignment occurs, a margin by which the strap wiring LS is allowed to be misaligned with the local via LV can be increased. Similarly, the following can be implemented by disposing the TMR element 101 in the center of the strap wiring LS in the direction of the short sides thereof: a margin by which the TMR element 101 is allowed to be misaligned with the strap wiring LS can be increased.

Figure 14:
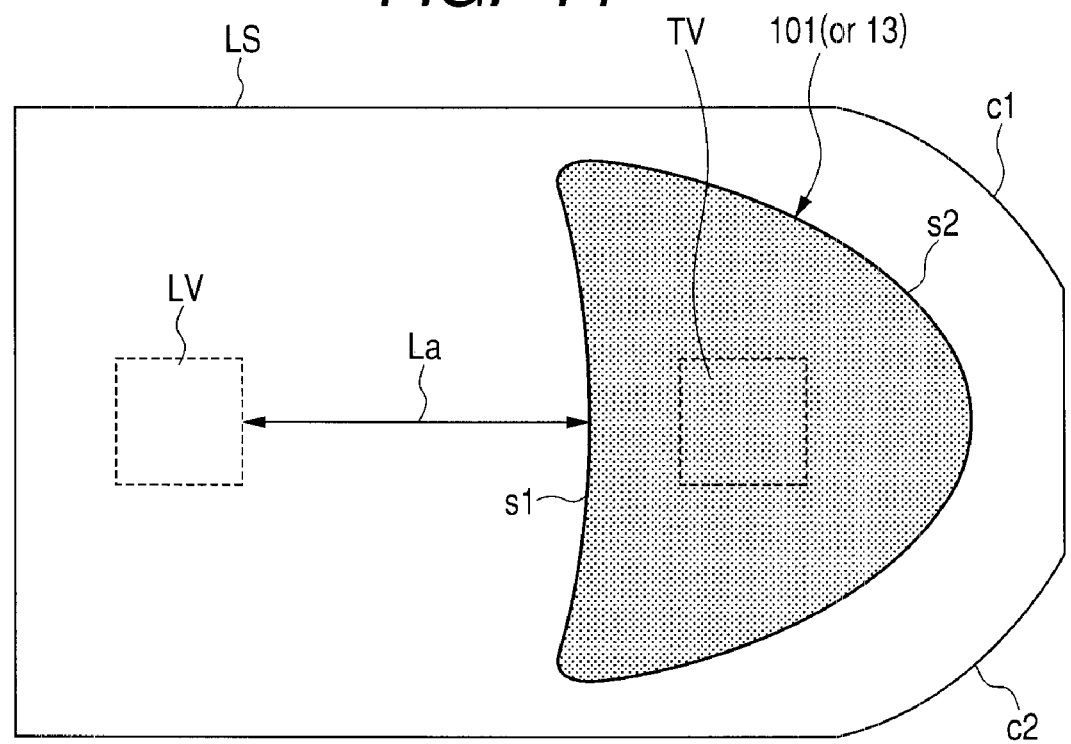
FIG. 14 is a plan view for explaining the shape of corner portions of a strap wiring facing the other contoured portion.

As illustrated in FIG. 14, the corner portions c1, c2 of the strap wiring LS facing the other contoured portion (arc) s2 of the TMR element 101 may be formed along the shape of the contoured portion s2.

When the strap wiring LS has the above corner portions c1, c2, the occupied area of the strap wiring LS is reduced more than with a configuration in which the corner portions c1, c2 are at a right angle. (An example of such a configuration is the configuration in FIG. 5.) Therefore, it is possible to further suppress increase in the size of the magnetic memory device (memory cell). In general, the shape of strap wirings LS formed by ordinary lithography process and etching process tends to be rounded at corner portions and it is more difficult to form a right-angled corner portion. Therefore, the strap wiring LS having the above corner portions c1, c2 can be easily formed by ordinary lithography process and etching process.

Figure 15:
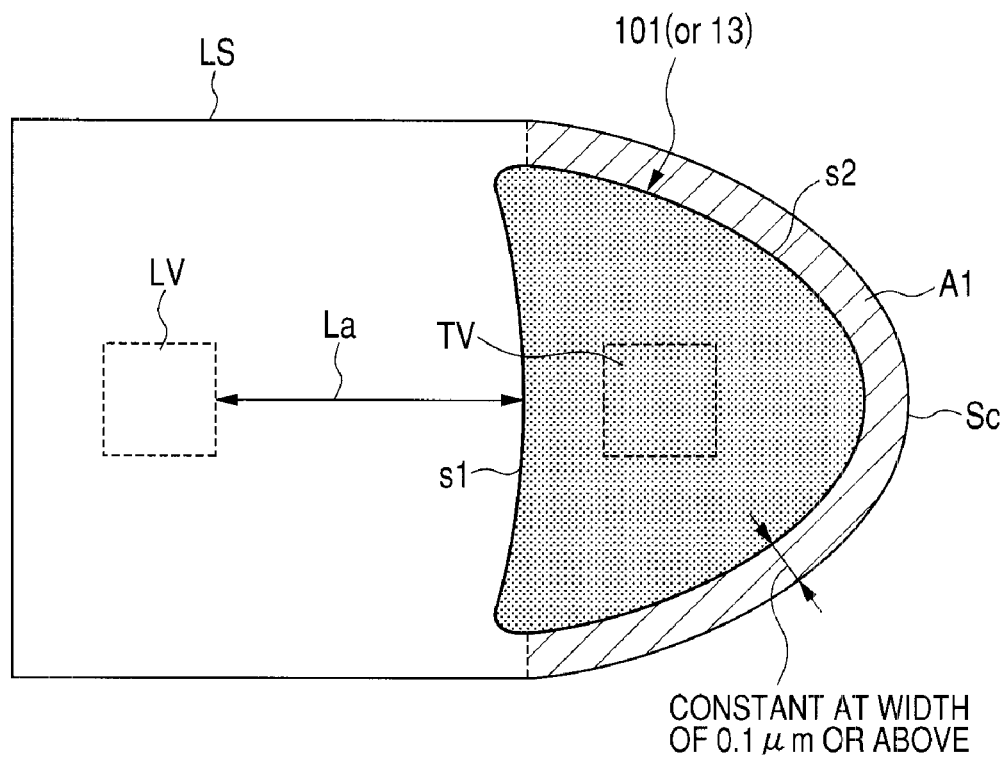
FIG. 15 is a plan view for explaining the relation between a TMR element and a short edge portion of a strap wiring facing the TMR element.

As illustrated in FIG. 15, it is desirable that the following distance should be 0.1 µm or above: the distance between the other contoured portion s2 of the TMR element 101 facing an end edge portion Sc of the strap wiring LS and the end edge portion Sc. The reason for this is as follows: even though etching misalignment occurs during etching of the strap wiring LS, overetch to the TMR element 101 can be prevented.

The width of the strap wiring area A1 (hatched area) positioned between the other contoured portion s2 and the end edge portion Sc may fluctuate from one place to another as long as it is 0.1 µm or above. However, it is more desirable that the width of the strap wiring area A1 (hatched area) positioned between the other contoured portion s2 and the end edge portion Sc should be constant regardless of place as illustrated in FIG. 15,.

When a configuration in which the width of the strap wiring area A1 is constant is adopted, the width is determined only from the viewpoint of the above overetch and a surplus area does not exist in the area A1 any more. That is, adoption of the configuration in which the above width is constant makes it possible to prevent the above overetch and further reduce the occupied area of the strap wiring LS.

Second Embodiment

Figure 16:
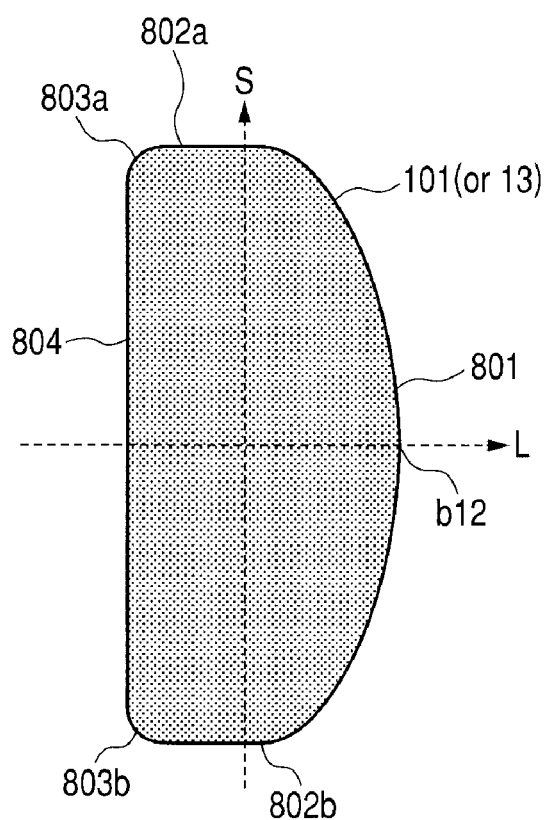
FIG. 16 is a plan view illustrating the asymmetric shape of a recording layer or a TMR element in a second embodiment.

In this embodiment, the TMR element 101 (or the recording layer 13) has the asymmetric shape illustrated in FIG. 16 as viewed on a plane. That is, at least the recording layer 13 has the asymmetric shape illustrated in FIG. 16. The following description is on the assumption that the planar shape of the entire TMR element 101 is this asymmetric shape.

As illustrated in FIG. 16, the TMR element 101 is asymmetric with respect to the easy magnetization axis S. It has the symmetric property with respect to the axis of symmetry (that can be understood as the direction of hard magnetization axis) L perpendicular to the easy magnetization axis S. That is, in the asymmetric shape illustrated in FIG. 16 as an example, one contoured portion 804 of the TMR element 101 opposed to the easy magnetization axis S has a linear shape. Meanwhile, the other contoured portion 801 of the TMR element 101 opposed to the easy magnetization axis S has such an outline that it is convex outward of the TMR element 101 (to the right side of FIG. 16).

The one contoured portion 804 is parallel with the direction of the easy magnetization axis S. The other contoured portion 801 has a fragmentary portion b12 positioned on the axis of symmetry L. The tangential line at the fragmentary portion b12 is parallel with the direction of the easy magnetization axis S.

Specifically, the asymmetric shape illustrated in FIG. 16 has three straight portions 802a, 802b, 804 and three arcs 801, 803a, 803b. The arc 801, straight portion 802b, arc 803b, straight portion 804, arc 803a, straight portion 802a, and arc 801 are coupled in this order to form a closed curve. As mentioned above, the straight portion 804 is parallel with the direction of the easy magnetization axis S. The straight portions 802a, 802b are parallel with the hard magnetization axis (axis of symmetry L).

The arc (the other contoured portion) 801 is an arc defined by a predetermined curvature. Both the arcs 803a and arc 803b are arcs defined by a curvature different from the predetermined curvature.

In place of the configuration in FIG. 16, an asymmetric shape without the arc 803a or 803b may be adopted. In the asymmetric shape, the straight portion 802a and the straight portion 804 intersect each other at a right angle at the arc 803a; and the straight portion 802b and the straight portion 804 intersect each other at a right angle at the arc 803b. (This shape will be referred to as right-angled intersection shape.) However, it is difficult to form this right-angled intersection shape by one step of lithography. However, the asymmetric shape illustrated in FIG. 16 can be easily formed by only one step of lithography when such an asymmetric shape having arcs 803a, 803b in place of an acute angle as illustrated in FIG. 16. In place of the configuration in FIG. 16, conversely an asymmetric shape without a straight portion 802a or 802b may be adopted. In this asymmetric shape, the arcs 803a, 803b are coupled to the arc 801 without the intervention of a straight portion. Adoption of this shape makes it possible to easily form the asymmetric shape by only one step of lithography.

Figure 17:
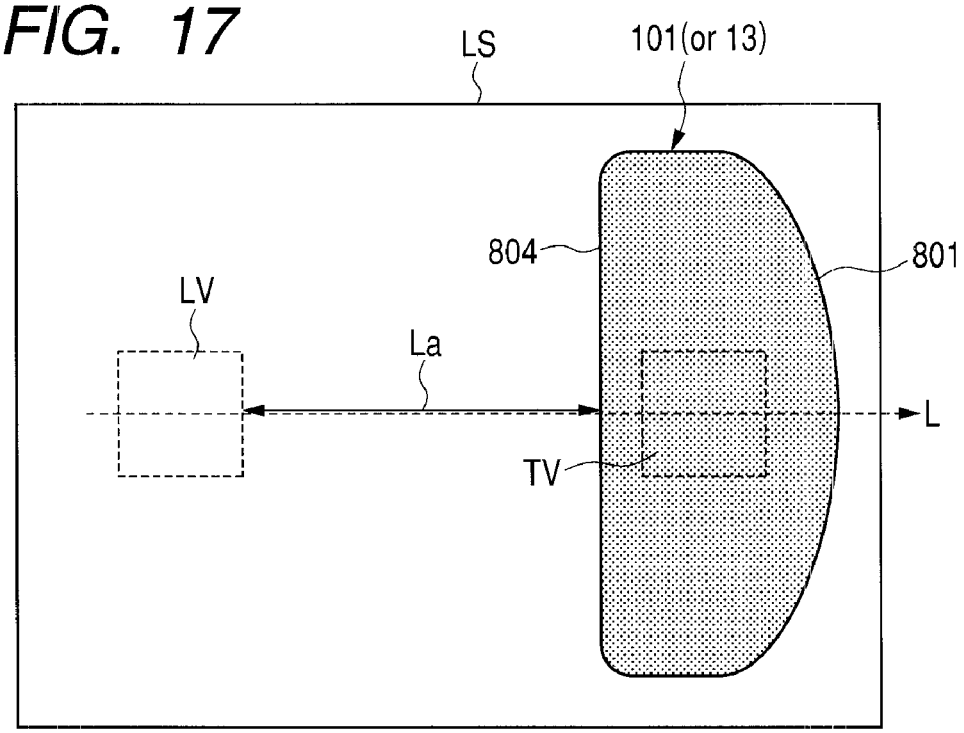
FIG. 17 is a plan view illustrating the arrangement relation between a local via and a TMR element in the second embodiment.

FIG. 17 is a plan view illustrating the arrangement relation between a TMR element 101 and a local via LV formed in a strap wiring LS. The entire TMR element 101 (or at least the recording layer 13) illustrated in FIG. 17 has the asymmetric shape illustrated in FIG. 16. (This is the same with FIGS. 18 to 20 referred to later.) The following description with reference to FIGS. 17 to 20 is on the assumption that the entire TMR element 101 has the asymmetric shape illustrated in FIG. 16.

As illustrated in FIG. 17, the one contoured portion (straight portion) 804 having the above-mentioned linear shape as viewed on a plane is opposed to the local via (that can be grasped as contact via) LV formation side. In other words, the other contoured portion (arc) 801 having the convex outline is not opposed to the local via LV formation side.

In the asymmetric shape illustrated in FIG. 16, the barycenter (center of area) exists on the axis of symmetry L and is positioned closer to the straight portion 804 than to the arc 801. As defined in relation to the first embodiment, the center of area cited here refers to the center of mass of a predetermined plane when the mass is evenly distributed in the plane. In the configuration illustrated in FIG. 17, therefore, the contoured portion (straight portion) 804 of the TMR element 101 on the side closer to the center of area of the TMR element 101 is opposed to the local via LV formation side.

The planar shape of the strap wiring LS is substantially rectangular. The local via LV and the TMR element 101 are arranged alongside in the direction of the length of the strap wiring LS as viewed on a plane.

The TMR element 101 and the local via LV formed in the strap wiring LS are so arranged that they are away from each other by a predetermined distance La as viewed on a plane. In the configuration illustrated in FIG. 17, the local via LV is arranged on the extended line of the axis of symmetry L of the TMR element 101.

In this embodiment, as mentioned above, the TMR element 101 having the asymmetric shape illustrated in FIG. 16 is arranged over the strap wiring LS so that the straight portion 804 side thereof is opposed to the local via LV. (Refer to FIG. 17.) In other words, the contoured portion (straight portion) 804 of the TMR element 101 on the side closer to the barycenter (center of area) of the TMR element 101 is opposed to the local via LV formation side. (Refer to FIG. 17.)

Figure 18:
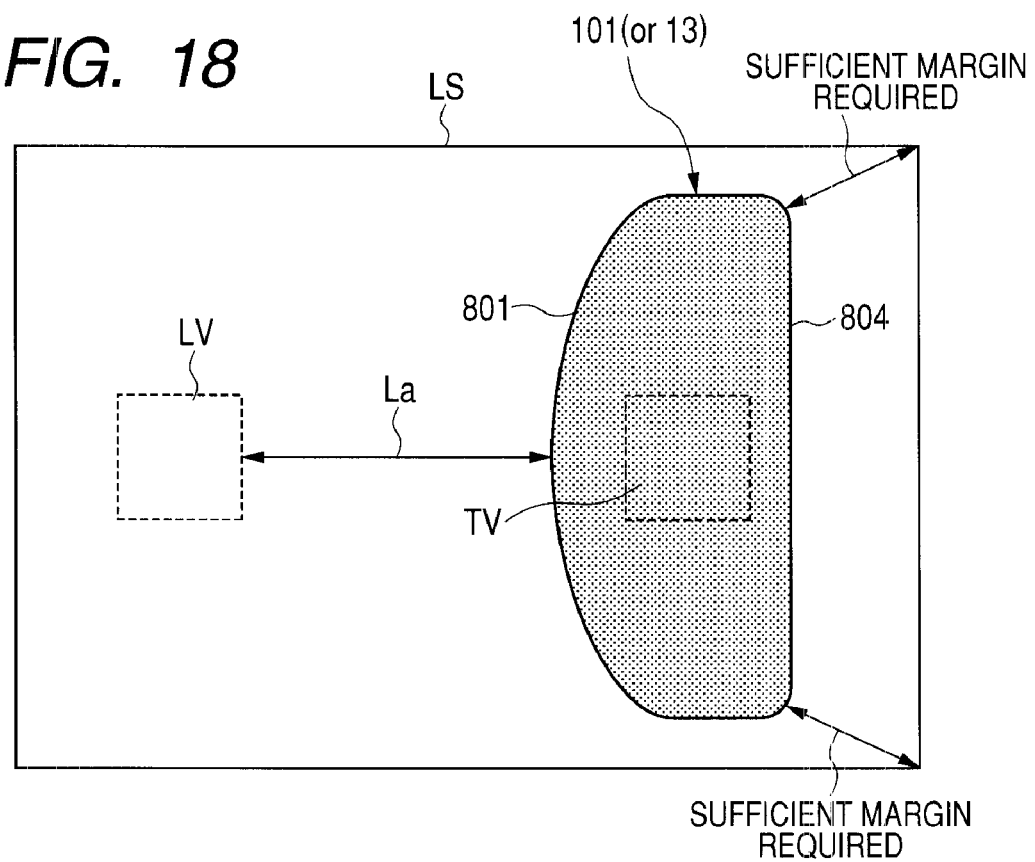
FIG. 18 is a plan view for explaining the effect of a configuration in the second embodiment.

Thus the following can be implemented even when the TMR element 101 and the local via LV are formed over the strap wiring LS with a sufficient distance allowed therebetween: increase in the size of the magnetic memory device (memory cell) can be suppressed. That is, increase in the size of the magnetic memory device (memory cell) can be suppressed more with the configuration illustrated in FIG. 17 than when the other contoured portion (arc) 801 is opposed to the local via LV as illustrated in FIG. 18.

When the strap wiring LS is formed by etching, a predetermined margin is required between a corner of the strap wiring LS and the TMR element 101. A larger margin can be allowed between a corner of the strap wiring LS and the TMR element 101 when the TMR element 101 is placed with the orientation illustrated in FIG. 17 than in the following cases: cases where the TMR element 101 is placed with the orientation illustrated in FIG. 18.

More specific description will be given. With the configuration in FIG. 18, it is required to position the end side of the strap wiring LS on the TMR element 101 formation side farther away from the TMR element 101 to ensure the above margin. With the configuration illustrated in FIG. 17, meanwhile, a larger margin can be ensured between a corner of the strap wiring LS and the TMR element 101 than with the configuration illustrated in FIG. 18. With the configuration illustrated in FIG. 17, therefore, it is possible to position the end side of the strap wiring LS on the TMR element 101 formation side closer to the TMR element 101.

As seen from the above comparison, the area of the strap wiring LS can be reduced more with the configuration in FIG. 17. As the result of reduction of the area of the strap wiring LS, it is possible to suppress increase in the size of the magnetic memory device (memory cell).

In this embodiment, as mentioned above, a sufficient distance is allowed between the TMR element 101 and the local via LV formed in the strap wiring LS as viewed on a plane. Therefore, it is possible to suppress the influence of a depressed portion, formed over the strap wiring LS due to the formation of the local via LV, on the TMR element 101. Thus it is possible to suppress variation in the write characteristic of the TMR element 101 due to the influence of the depressed portion.

The planar shape of the strap wiring LS is substantially rectangular. The local via LV and the TMR element 101 are arranged alongside in the direction of the length of the strap wiring LS as viewed on a plane. (Refer to FIG. 17.)

Therefore, it is possible to reduce the distance between cells adjoining in the direction of the digit lines and efficiently dispose the strap wirings LS.

Figure 19:
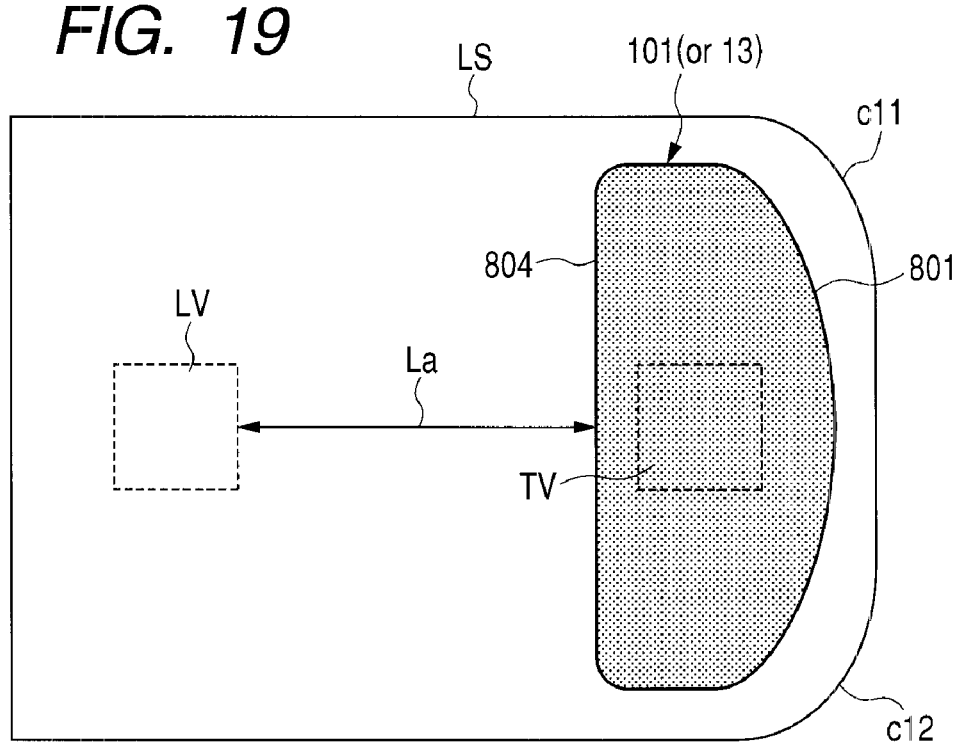
FIG. 19 is a plan view for explaining the shape of corner portions of a strap wiring facing the other contoured portion.

As illustrated in FIG. 19, the corner portions c11, c12 of the strap wiring LS facing the other contoured portion (arc) 801 of the TMR element 101 may be formed along the shape of the other contoured portion 801.

When the strap wiring LS has the above corner portions c11, c12, the occupied area of the strap wiring LS is reduced more than with a configuration in which the corner portions c11, c12 are at a right angle. (An example of such a configuration is the configuration in FIG. 17.) Therefore, it is possible to further suppress increase in the size of the magnetic memory device (memory cell). In general, the shape of strap wirings LS formed by ordinary lithography process and etching process tends to be rounded at corner portions and it is more difficult to form a right-angled corner portion. Therefore, the strap wiring LS having the above corner portions c11, c12 can be easily formed by ordinary lithography process and etching process.

Figure 20:
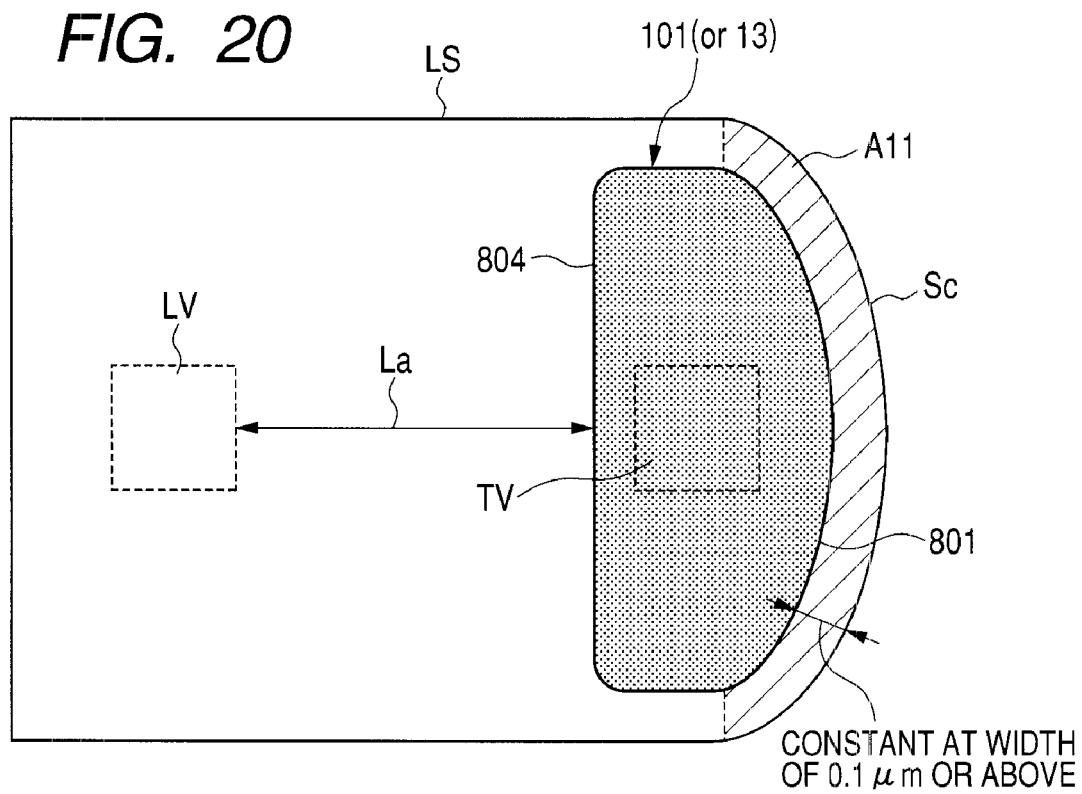
FIG. 20 is a plan view for explaining the relation between a TMR element and a short edge portion of a strap wiring facing the TMR element.

As illustrated in FIG. 20, it is desirable that the following distance should be 0.1 μm or above: the distance between the other contoured portion 801 of the TMR element 101 facing an end edge portion Sc of the strap wiring LS and the end edge portion Sc. The reason for this is as follows: even when etching misalignment occurs during etching of the strap wiring LS, overetch to the TMR element 101 can be prevented.

The width of the strap wiring area A11 (hatched area) positioned between the other contoured portion 801 and the end edge portion Sc may fluctuate from one place to another as long as it is 0.1 μm or above. However, it is more desirable that the width of the strap wiring area A11 (hatched area) positioned between the other contoured portion 801 and the end edge portion Sc should be constant regardless of place as illustrated in FIG. 20.

When a configuration in which the width of the strap wiring area A11 is constant is adopted, the width is determined only from the viewpoint of the above overetch and a surplus area does not exist in the area A11 any more. That is, adoption of the configuration in which the above width is constant makes it possible to prevent the above overetch and further reduce the occupied area of the strap wiring LS.

Third Embodiment

Figure 21:
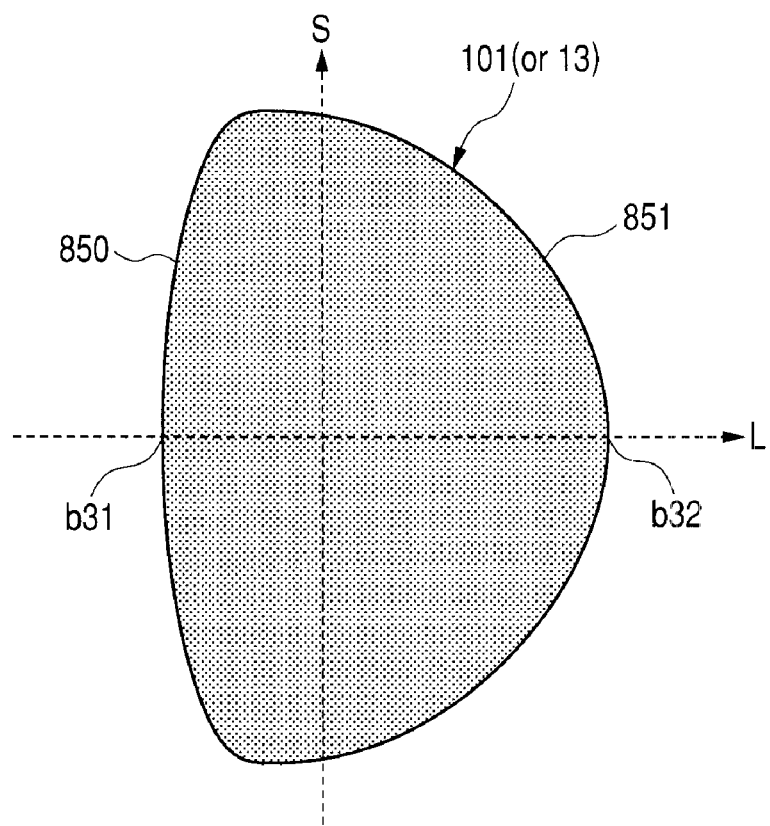
FIG. 21 is a plan view illustrating the asymmetric shape of a recording layer or a TMR element in a third embodiment.

In this embodiment, the TMR element 101 (or the recording layer 13) has the asymmetric shape illustrated in FIG. 21 as viewed on a plane. That is, at least the recording layer 13 has the asymmetric shape illustrated in FIG. 21. The following description is on the assumption that the planar shape of the entire TMR element 101 is this asymmetric shape.

As illustrated in FIG. 21, the TMR element 101 is asymmetric with respect to the easy magnetization axis S. It has the symmetric property with respect to the axis of symmetry (that can be understood as the direction of hard magnetization axis) L perpendicular to the easy magnetization axis S. That is, in the asymmetric shape illustrated in FIG. 21 as an example, one contoured portion 850 of the TMR element 101 opposed to the easy magnetization axis S has such an outline that the following is implemented: it is convex outward of the TMR element 101 (to the left side of FIG. 21) with a first curvature. Meanwhile, the other contoured portion 851 of the TMR element 101 opposed to the easy magnetization axis S has such an outline that the following is implemented: it is convex outward of the TMR element 101 (to the right side of FIG. 21) with a second curvature. The second curvature is larger than the first curvature.

Both the one contoured portion 850 and the other contoured portion 851 have fragmentary portions b31, b32 positioned on the axis of symmetry L. Both the tangential line at the fragmentary portion b31 and the tangential line at the fragmentary portion b32 are parallel with the direction of the easy magnetization axis S.

Specifically, the asymmetric shape illustrated in FIG. 21 has two arcs 850, 851 different in curvature. The arc 850 and the arc 851 are coupled to form a closed curve. The outline of the asymmetric shape illustrated in FIG. 21 does not include the outline of a straight portion. Adoption of such an asymmetric shape comprised only of arcs as illustrated in FIG. 21 makes it possible to easily form the asymmetric shape illustrated in FIG. 21 by only one step of lithography.

Figure 22:
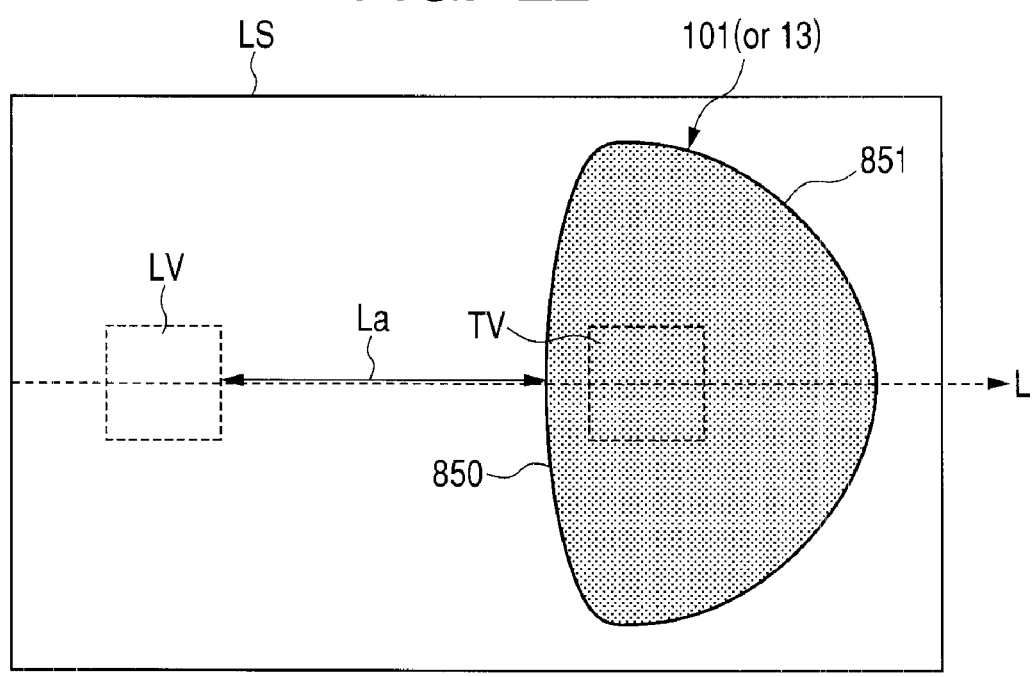
FIG. 22 is a plan view illustrating the arrangement relation between a local via and a TMR element in the third embodiment.

FIG. 22 is a plan view illustrating the arrangement relation between a TMR element 101 and a local via LV formed in a strap wiring LS. The entire TMR element 101 (or at least the recording layer 13) illustrated in FIG. 22 has the asymmetric shape illustrated in FIG. 21. (This is the same with FIGS. 23 to 25 referred to later.) The following description with reference to FIGS. 22 to 25 is on the assumption that the entire TMR element 101 has the asymmetric shape illustrated in FIG. 21.

As illustrated in FIG. 22, the one contoured portion (arc) 850 having the first curvature is opposed to the local via (that can be grasped as contact via) LV formation side as viewed on a plane. In other words, the other contoured portion (arc) 851 having the second curvature is not opposed to the local via LV formation side.

In the asymmetric shape illustrated in FIG. 21, the barycenter (center of area) exists on the axis of symmetry L and is positioned closer to the arc 850 than to the arc 851. As defined in relation to the first embodiment, the center of area cited here refers to the center of mass of a predetermined plane when the mass is evenly distributed in the plane. In the configuration illustrated in FIG. 22, therefore, the contoured portion (arc) 850 of the TMR element 101 on the side closer to the center of area of the TMR element 101 is opposed to the local via LV formation side.

The planar shape of the strap wiring LS is substantially rectangular. The local via LV and the TMR element 101 are arranged alongside in the direction of the length of the strap wiring LS as viewed on a plane.

The TMR element 101 and the local via LV formed in the strap wiring LS are so arranged that they are away from each other by a predetermined distance La as viewed on a plane. In the configuration illustrated in FIG. 22, the local via LV is arranged on the extended line of the axis of symmetry L of the TMR element 101.

In this embodiment, as mentioned above, the TMR element 101 having the asymmetric shape illustrated in FIG. 21 is arranged over the strap wiring LS so that the arc 850 side thereof having the first curvature is opposed to the local via LV. (Refer to FIG. 22.) In other words, the contoured portion (arc) 850 of the TMR element 101 on the side closer to the barycenter (center of area) of the TMR element 101 is opposed to the local via LV formation side. (Refer to FIG. 22.)

Figure 23:
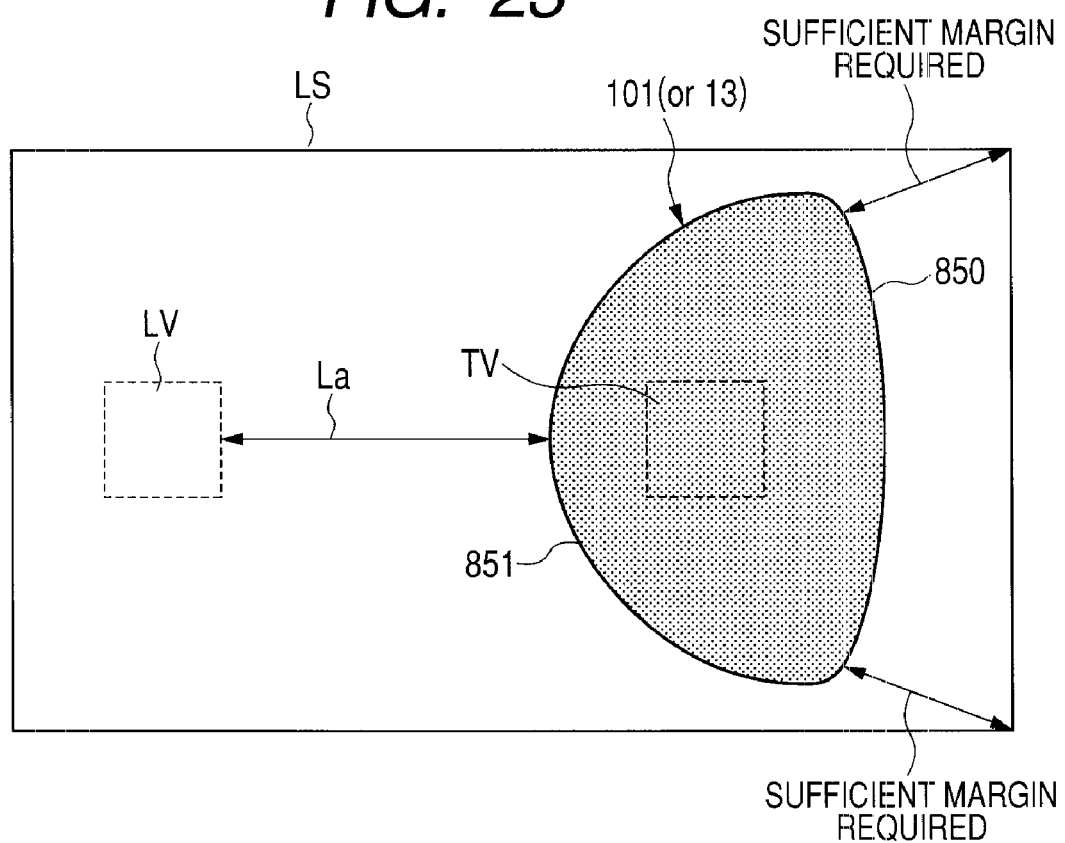
FIG. 23 is a plan view for explaining the effect of a configuration in the third embodiment.

Thus the following can be implemented even when the TMR element 101 and the local via LV are formed over the strap wiring LS with a sufficient distance allowed therebetween: increase in the size of the magnetic memory device (memory cell) can be suppressed. That is, increase in the size of the magnetic memory device (memory cell) can be suppressed more with the configuration illustrated in FIG. 22 than when the other contoured portion (arc) 851 is opposed to the local via LV as illustrated in FIG. 23.

When the strap wiring LS is formed by etching, a predetermined margin is required between a corner of the strap wiring LS and the TMR element 101. A larger margin can be allowed between a corner of the strap wiring LS and the TMR element 101 when the TMR element 101 is placed with the orientation illustrated in FIG. 22 than in the following cases: cases where the TMR element 101 is placed with the orientation illustrated in FIG. 23.

More specific description will be given. With the configuration in FIG. 23, it is required to position the end side of the strap wiring LS on the TMR element 101 formation side farther away from the TMR element 101 to ensure the above margin. With the configuration illustrated in FIG. 22, meanwhile, a larger margin can be ensured between a corner of the strap wiring LS and the TMR element 101 than with the configuration illustrated in FIG. 23. With the configuration illustrated in FIG. 22, therefore, it is possible to position the end side of the strap wiring LS on the TMR element 101 formation side closer to the TMR element 101.

As seen from the above comparison, the area of the strap wiring LS can be reduced more with the configuration in FIG. 22. As the result of reduction of the area of the strap wiring LS, it is possible to suppress increase in the size of the magnetic memory device (memory cell).

In this embodiment, as mentioned above, a sufficient distance is allowed between the TMR element 101 and the local via LV formed in the strap wiring LS as viewed on a plane. Therefore, it is possible to suppress the influence of a depressed portion, formed over the strap wiring LS due to the formation of the local via LV, on the TMR element 101. Thus it is possible to suppress variation in the write characteristic of the TMR element 101 due to the influence of the depressed portion.

The planar shape of the strap wiring LS is substantially rectangular. The local via LV and the TMR element 101 are arranged alongside in the direction of the length of the strap wiring LS as viewed on a plane. (Refer to FIG. 22.)

Therefore, it is possible to reduce the distance between cells adjoining in the direction of the digit lines and efficiently dispose the strap wirings LS.

Figure 24:
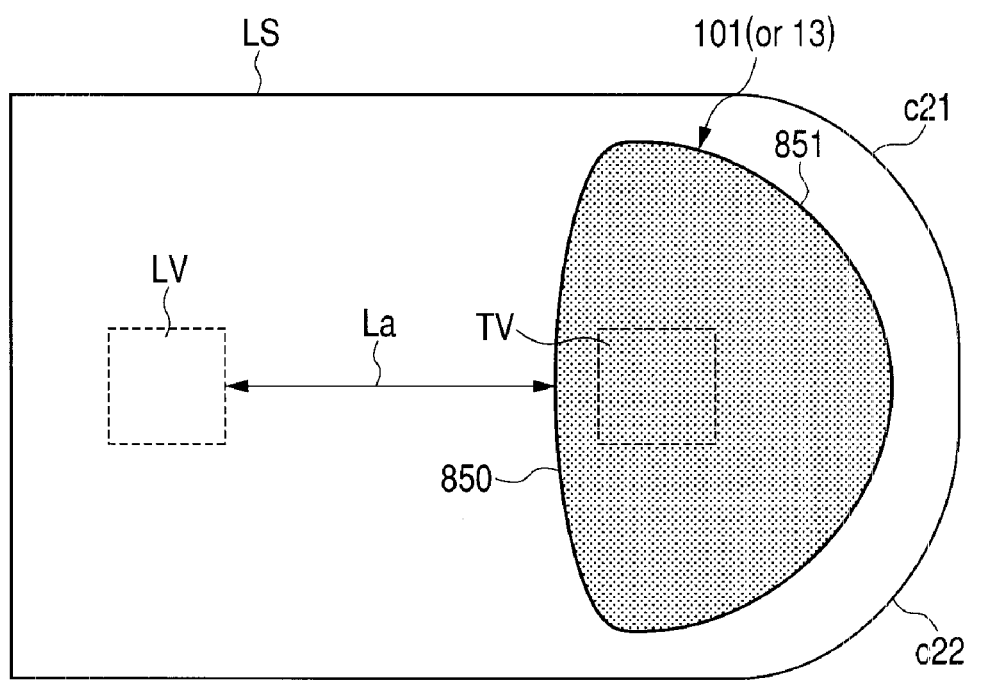
FIG. 24 is a plan view for explaining the shape of corner portions of a strap wiring facing the other contoured portion.

As illustrated in FIG. 24, the corner portions c21, c22 of the strap wiring LS facing the other contoured portion (arc) 851 of the TMR element 101 may be formed along the shape of the other contoured portion 851.

When the strap wiring LS has the above corner portions c21, c22, the occupied area of the strap wiring LS is reduced more than with a configuration in which the corner portions c21, c22 are at a right angle. (An example of such a configuration is the configuration in FIG. 22.) Therefore, it is possible to further suppress increase in the size of the magnetic memory device (memory cell). In general, the shape of strap wirings LS formed by ordinary lithography process and etching process tends to be rounded at corner portions and it is more difficult to form a right-angled corner portion. Therefore, the strap wiring LS having the above corner portions c21, c22 can be easily formed by ordinary lithography process and etching process.

Figure 25:
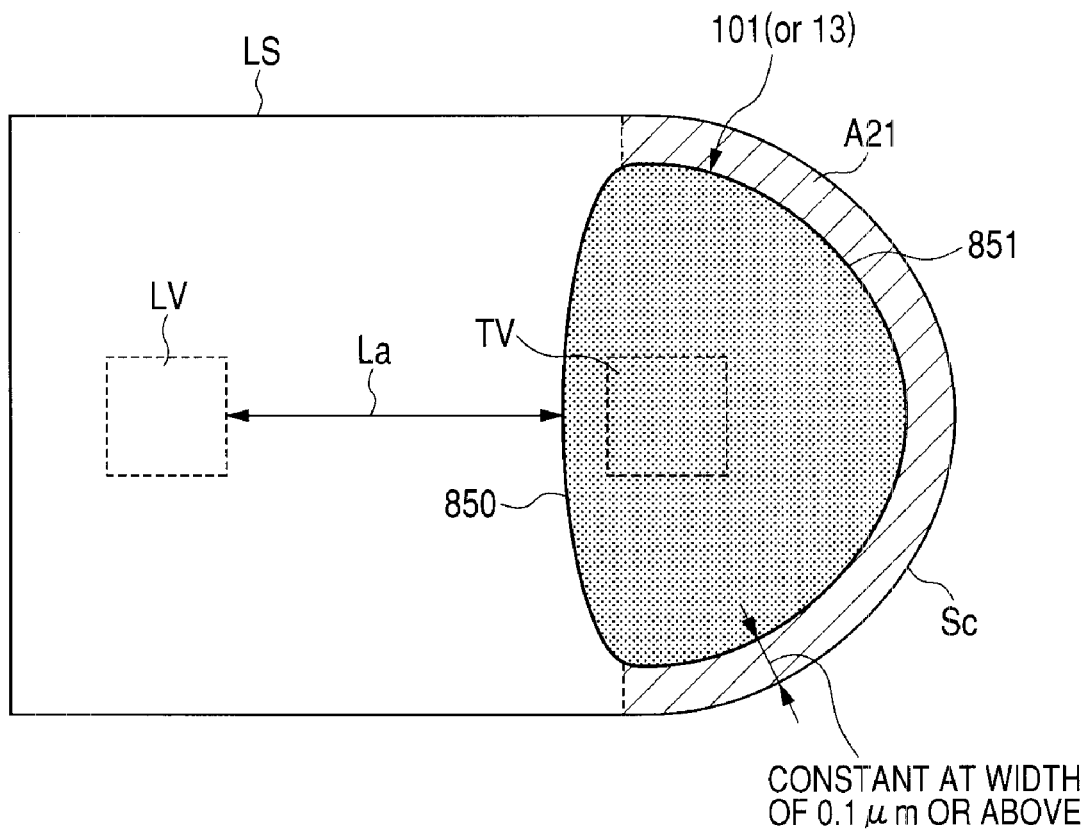
FIG. 25 is a plan view for explaining the relation between a TMR element and a short edge portion of a strap wiring facing the TMR element.

As illustrated in FIG. 25, it is desirable that the following distance should be 0.1 µm or above: the distance between the other contoured portion 851 of the TMR element 101 facing an end edge portion Sc of the strap wiring LS and the end edge portion Sc. The reason for this is as follows: even when etching misalignment occurs during etching of the strap wiring LS, overetch to the TMR element 101 can be prevented.

The width of the strap wiring area A21 (hatched area) positioned between the other contoured portion 851 and the end edge portion Sc may fluctuate from one place to another as long as it is 0.1 µm or above. However, it is more desirable that the width of the strap wiring area A21 (hatched area) positioned between the other contoured portion 851 and the end edge portion Sc should be constant regardless of place as illustrated in FIG. 25.

When a configuration in which the width of the strap wiring area A21 is constant is adopted, the width is determined only from the viewpoint of the above overetch and a surplus area does not exist in the area A21 any more. That is, adoption of the configuration in which the above width is constant makes it possible to prevent the above overetch and further reduce the occupied area of the strap wiring LS.

Fourth Embodiment

In the description of the above embodiments, the 1Tr-1TMR cell configuration has been taken as an example. In relation to this embodiment, description will be given to the arrangement relation between a local via LV and each TMR element (recording layer 13) formed in a strap wiring LS with 1Tr-4TMR cell configuration adopted. The 1Tr-4TMR (1Tr-1TMR) cited here means that each memory cell is composed of one element selection transistor and four TMR elements (or one TMR element).

Figure 27:
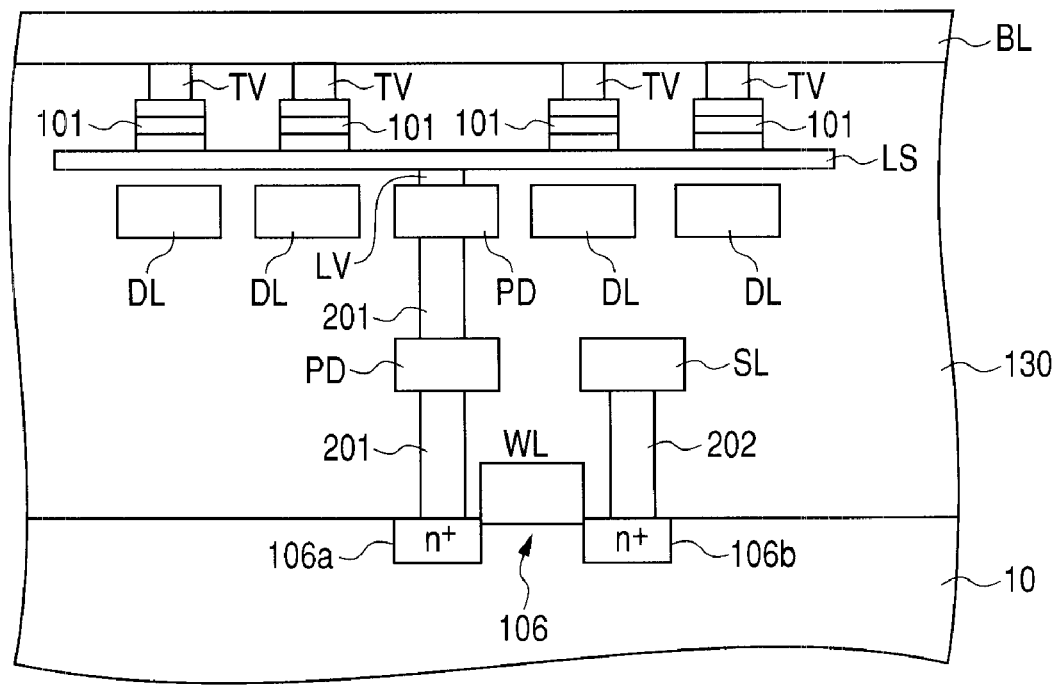
FIG. 27 is a schematic sectional view illustrating the configuration of a 1Tr-4TMR cell.
Figure 26:
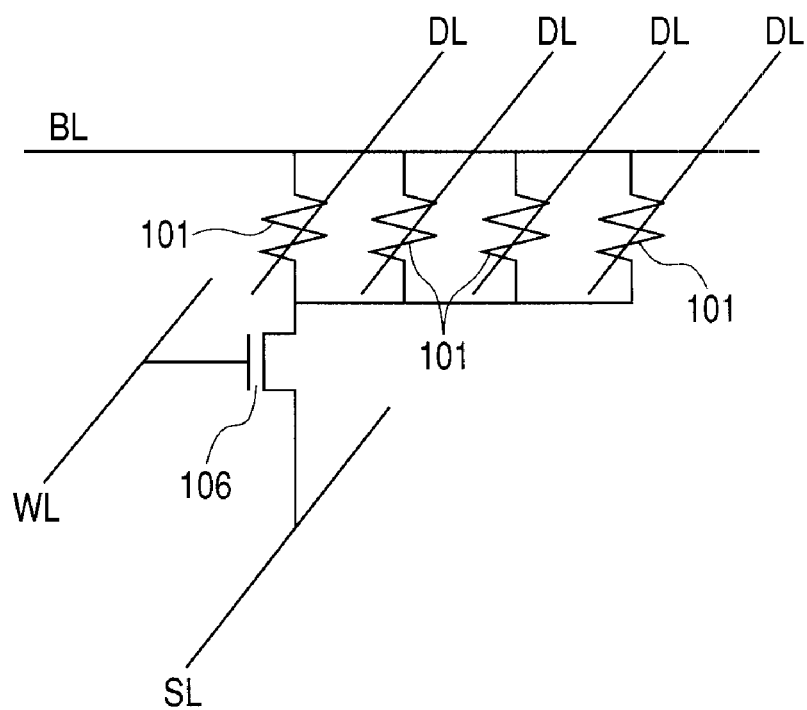
FIG. 26 is a circuit diagram illustrating the configuration of a 1Tr-4TMR cell.

FIG. 26 is a circuit diagram of a cell of the 1Tr-4TMR cell configuration. FIG. 27 is a schematic sectional view illustrating the configuration of a 1Tr-4TMR cell.

As illustrated in FIG. 26, the 1Tr-4TMR cell includes series coupling of an element selection transistor 106 and multiple TMR elements 101 coupled in parallel. More specifically, each TMR element 101 is arranged at the intersection between a digit line DL and a bit line BL.

In the 1Tr-4TMR cell, as illustrated in FIG. 27, the element selection transistor 106 is formed in the top surface of a semiconductor substrate 10. Over the semiconductor substrate 10, an interlayer insulating film 130 is formed. In the interlayer insulating film 130, the following are arranged: a word line WL, contact vias 201, 202, a source line SL, pad electrodes PD, four digit lines DL, a local via LV, strap wiring LS, four TMR elements 101, four top vias TV, a bit line BL, and the like. In the surface of the semiconductor substrate 10, source and drain impurity diffusion layers 106a, 106b are formed.

The word line WL functions as the gate electrode of the element selection transistor 106. Though omitted in FIG. 27, the gate structure including the gate electrode is a laminated structure obtained by forming a gate insulating film and a gate electrode layer in this order. On both the side faces of the gate structure, a side wall film is formed. The drain 106a of the element selection transistor 106 is coupled to the four TMR elements 101 through the contact plugs 201, pad electrodes PD, local via LV, and strap wiring (also referred to as local strap) LS. The source 106b of the element selection transistor 106 is coupled to the source line SL through the contact plug 202.

A local via LV of stacked via structure that does not have a pad electrode PD may be adopted.

Between the strap wiring LS and the semiconductor substrate 10, the four digit lines DL are placed so that they are insulated through the interlayer insulating film 130. Each TMR element 101 and the bit line BL are electrically coupled together through a top via (contact via) TV. As illustrated in FIG. 27, the upper part of the local via LV is coupled to the under surface side of the strap wiring LS. That is, the strap wiring LS and portions (for example, the drain 106a) positioned under the strap wiring LS are electrically coupled together through the local via (contact via) LV. Meanwhile, the top surface side of the strap wiring LS is coupled with the under surfaces of the TMR elements 101.

As illustrated in FIG. 27 as well, the individual TMR elements 101 are respectively placed in the area where each digit line DL and the bit line BL intersect each other.

Four-bit data can be stored in the 1Tr-4TMR cell illustrated in FIGS. 26 and 27. In a 1Tr-1TMR cell, one-bit data is stored. The 1TR-4TMR cell structure is disclosed in, for example, Japanese Unexamined Patent Publication No. 2006-294179.

Figure 28:
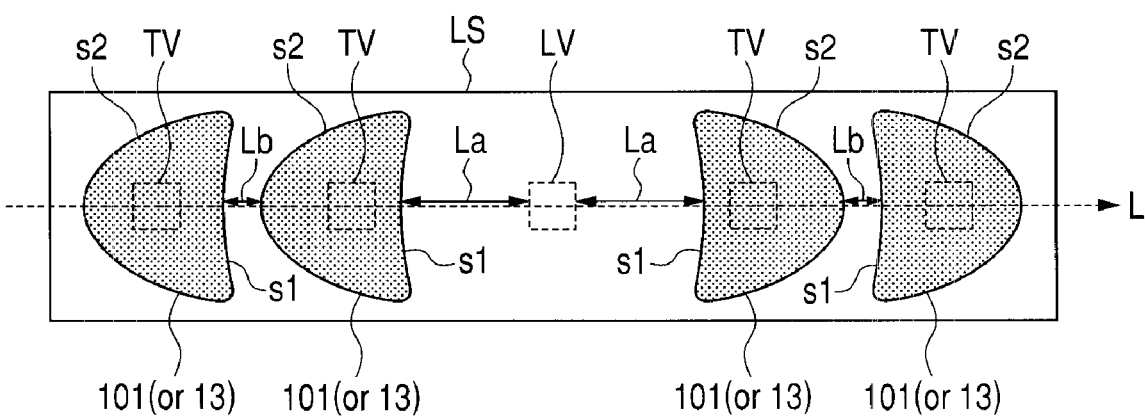
FIG. 28 is a plan view illustrating the arrangement relation between a local via and TMR elements in a fourth embodiment.

FIG. 28 is a plan view of the strap wiring LS illustrated in FIG. 27.

FIG. 28 illustrates the arrangement relation between the four TMR elements 101 and the one local via LV formed in the strap wiring LS.

Figure 29:
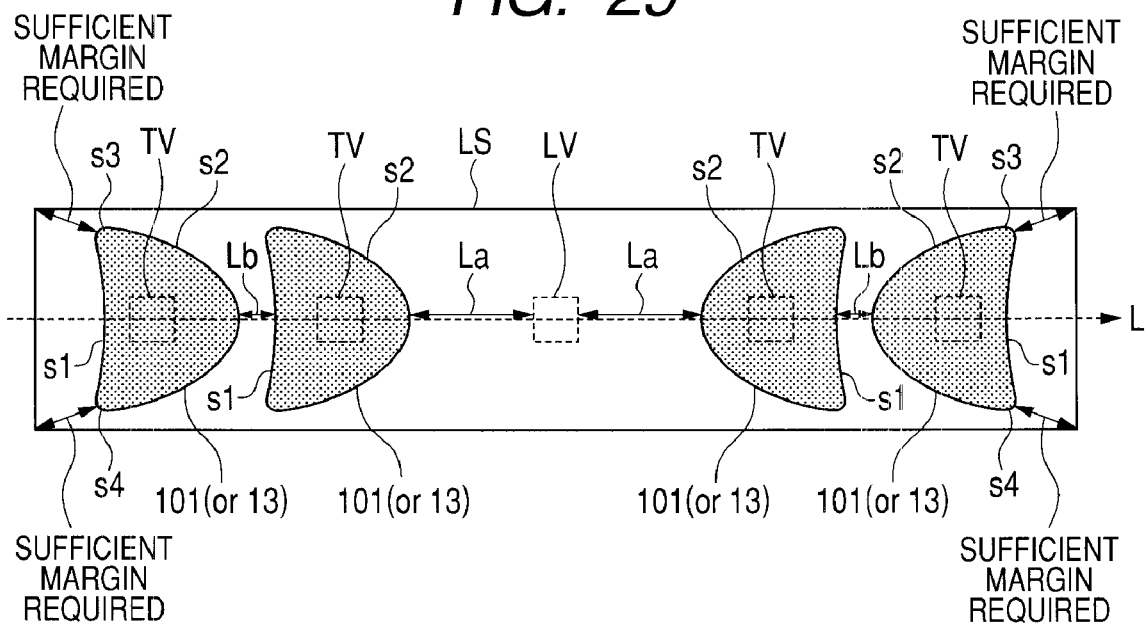
FIG. 29 is a plan view for explaining the effect of a configuration in the fourth embodiment.
Figure 30:
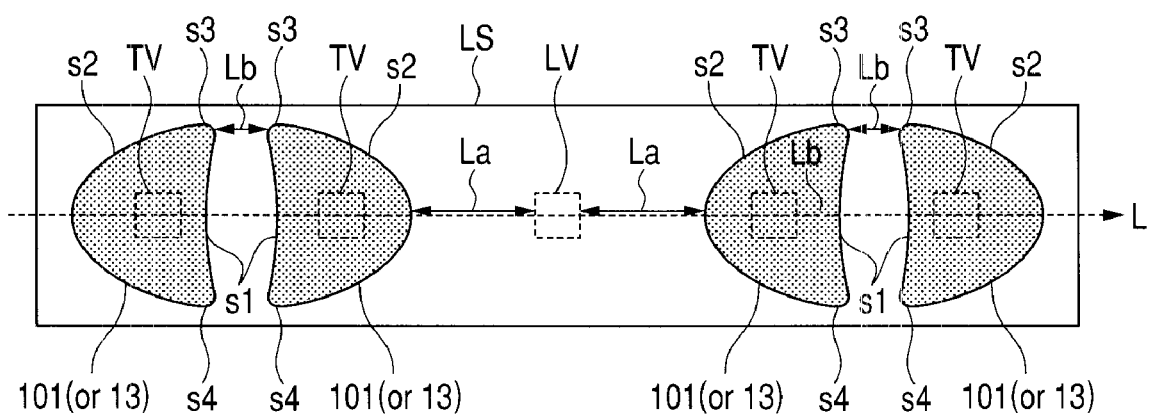
FIG. 30 is a plan view for explaining the effect of a configuration in the fourth embodiment.

Each of the entire TMR elements 101 (or at least the recording layers 13) illustrated in FIG. 28 has the asymmetric shape described in relation to the first embodiment (FIG. 4). (This is the same with FIGS. 29 and 30 referred to later.) The following description with reference to FIGS. 28 to 30 is on the assumption that each of the entire TMR elements 101 has the asymmetric shape illustrated in FIG. 4. The asymmetric shape of the TMR element 101 has been described in detail in relation to the first embodiment. Therefore, the description of the shape of the TMR element 101 in this embodiment will be omitted.

In this embodiment, as illustrated in FIG. 28, four TMR elements 101 are formed over the top surface of a strap wiring LS. Two TMR elements 101 are respectively placed on the right and left of a local via LV coupled at the under surface of the strap wiring LS. More specific description will be given. As illustrated in FIG. 28, two (that can be grasped as a first number) TMR elements 101 are arranged alongside on the left side (that can be grasped as first side) of the local via LV in the drawing. Two (that can be grasped as a second number) TMR elements 101 are arranged alongside on the right side (that can be grasped as second side) of the local via LV in the drawing. Predetermined distances are provided between adjoining TMR elements 101.

As described in relation to the first embodiment with reference to FIG. 5, every TMR element 101 is arranged with the orientation described below. In every TMR element 101, as illustrated in FIG. 28, one contoured portion (arc) s1 having a concave outline thereof is opposed to the local via LV formation side as viewed on a plane. In other words, the other contoured portion (arc) s2 having a convex outline thereof is not opposed to the local via LV formation side.

In each TMR element 101, the barycenter (center of area) exists on the axis of symmetry L and is positioned closer to the arc s1 than to the arc s2. The center of area cited here refers to the center of mass of a predetermined plane when the mass is evenly distributed in the plane. In the configuration in FIG. 28, therefore, the following is implemented in every TMR element: the contoured portion (arc) s1 of the TMR element 101 on the side closer to the center of area of the TMR element 101 is opposed to the local via LV formation side.

The planar shape of the strap wiring LS is substantially rectangular. As mentioned above, the local via LV and the TMR elements 101 are arranged alongside in the direction of the length of the strap wiring LS as viewed on a plane.

The local via LV formed in the strap wiring LS and each TMR element 101 adjacent to the local via LV are arranged away from each other by a predetermined distance La as viewed on a plane. The adjoining TMR elements 101 are arranged away from each other by a distance Lb different from the distance La. In the configuration illustrated in FIG. 28, the axes of symmetry L of the individual TMR elements 101 are coaxially arranged. The local via LV is placed on the extended line of the axes of symmetry L.

In this embodiment, as mentioned above, every TMR element 101 having the asymmetric shape illustrated in FIG. 4 is arranged over the strap wiring LS so that the arc s1 side thereof is opposed to the local via LV. (Refer to FIG. 28.) In other words, the following is implemented in every TMR element 101: the contoured portion (arc) s1 of the TMR element 101 on the side closer to the barycenter (center of area) of the TMR element 101 is opposed to the local via LV formation side. (Refer to FIG. 28.)

Therefore, the occupied area of the strap wiring LS can be reduced more in the disposition in this embodiment illustrated in FIG. 28 than in the disposition in the first example and that in the second example described later.

The disposition in the first example is that illustrated in FIG. 29. That is, every TMR element 101 having the asymmetric shape illustrated in FIG. 4 is arranged over the strap wiring LS so that the arc s2 side thereof is opposed to the local via LV. The disposition in the second example is that in which the following is implemented: in each TMR element 101 closer to the local via LV, the arc s2 side thereof is opposed to the local via LV; and in each TMR element 101 farther from the local via LV, the arc s1 thereof is opposed to the local via LV. (Refer to FIG. 30.) Both in the disposition in the first example and in the disposition in the second example, the distance between the local via LV and each TMR element 101 adjacent to the local via LV is the distance La and the distance between the adjoining TMR elements 101 is the distance Lb. These distances La, Lb are the same as in the case illustrated in FIG. 28. Both in the disposition in the first example and in the disposition in the second example, the individual TMR elements 101 and the local via LV are arranged on the axes of symmetry L of the TMR elements 101.

In the disposition in the first example, as described in relation to the first embodiment as well, a sufficient etching margin is required for the following distance: the distance between the arcs s3, s4 of each TMR element 101 farther from the local via LV and the strap wiring LS. In the disposition in the first example, therefore, the occupied area of the strap wiring LS is larger than in the disposition illustrated in FIG. 28.

In the disposition in the second example, the arcs s3 of the adjoining TMR elements 101 are opposed to each other and the arcs s4 thereof are opposed to each other. As in the example illustrated in FIG. 28, it is required to provide the distance Lb between the arcs s3 and between the arcs s4. In the disposition in the second example, as a result, the distance between the adjoining TMR elements 101 on the axis of symmetry L is longer than in the disposition illustrated in FIG. 28. That is, the length of the strap wiring LS becomes larger in the disposition in the second example than in the disposition illustrated in FIG. 28. In the disposition in the second example, therefore, the occupied area of the strap wiring LS is larger than in the disposition illustrated in FIG. 28.

It is apparent from the foregoing that when multiple TMR elements 101 are formed over one strap wiring LS, the occupied area of the strap wiring LS is reduced most in the disposition illustrated in FIG. 28.

As mentioned above, a sufficient distance is allowed between each TMR element 101 and the local via LV over the strap wiring LS. Therefore, it is possible to suppress the influence of a depressed portion, produced over the strap wiring LS due to the formation of the local via LV, on each TMR element 101. Thus it is possible to suppress variation in the write characteristic of the TMR elements 101 due to the influence of the depressed portion.

In the above embodiments, the planar shape of the strap wiring LS is substantially rectangular. As described in relation to the first embodiment as well, however, the following measure may be taken: the corner portions of the strap wiring LS facing the other contoured portions (arc) s2 of TMR elements 101 may be formed along the shape of the other contoured portions s2. (Refer to reference alphanumerals c1 and c2 in FIG. 14.)

As described in relation to the first embodiment as well, it is desirable that the following distance should be 0.1 μm or above: the distance between the other contoured portion s2 of a TMR element 101 facing an end edge portion of the strap wiring LS and the end edge portion. (Refer to FIG. 15.) It is more desirable that the width of the strap wiring area positioned between the other contoured portion s2 and the end edge portion should be constant regardless of place. (Refer to reference alphanumeral A1 in FIG. 15.)

In this embodiment, four TMR elements 101 are arranged over one strap wiring LS. However, the number of TMR elements arranged over one strap wiring LS only has to be equal to or larger than two. That is, the disposition method in this embodiment is applicable to 1Tr-nTMR cell structures (n: positive number not less than 2). Also in case of the 1Tr-nTMR cell structure, however, the arcs s1 of all the n TMR elements 101 are opposed to the local via LV.

In this embodiment, TMR elements 101 of the same number are placed on both sides of the local via LV with the local via in the center as viewed on a plane. However, the invention need not be limited to this configuration as long as every TMR element 101 is arranged over the strap wiring LS so that the arc s1 side thereof is opposed to the local via LV. For example, the following configuration may be adopted: TMR elements 101 of a first number are arranged alongside on the first side of the local via LV; and TMR elements 101 of a second number are arranged alongside on the second side of the local via LV opposite the first side (first number≠second number).

In the description of this embodiment, a case where multiple TMR elements 101 (or recording layers 13) having the asymmetric shape described in relation to the first embodiment are arranged over one strap wiring LS has been taken as an example. However, the asymmetric shape of each TMR element 101 may be the shape described in relation to the second embodiment (FIG. 16) or the shape described in relation to the third embodiment (FIG. 21).

When the multiple TMR elements 101 are in the shape illustrated in FIG. 16, every TMR element 101 is arranged over the strap wiring LS so that the straight portion 804 thereof is opposed to the local via LV. (Refer to FIG. 17.) When the multiple TMR elements 101 are in the shape illustrated in FIG. 21, every TMR element 101 is arranged over the strap wiring LS so that the arc 850 side thereof having the first curvature is opposed to the local via LV. (Refer to FIG. 22.) Also in these cases, the TMR elements 101 are arranged on both sides of the local via LV as viewed on a plane as illustrated in FIG. 28.

When the multiple TMR elements 101 are in the shape illustrated in FIG. 16 as mentioned above, the shape illustrated in FIG. 19 can be adopted for the shape of the corner portions of the strap wiring LS. Further, the configuration illustrated in FIG. 20 can also be adopted for the shape of the end edge portions of the strap wiring LS. When the multiple TMR elements 101 are in the shape illustrated in FIG. 21, the shape illustrated in FIG. 24 can be adopted for the shape of the corner portions of the strap wiring LS. Further, the configuration illustrated in FIG. 25 can also be adopted for the shape of the end edge portions of the strap wiring LS.

Fifth Embodiment

In the description of this embodiment, a 1Tr-4TMR cell configuration other than the 1Tr-4TMR cell configuration described in relation to the fourth embodiment will be taken as an example.

Figure 31:
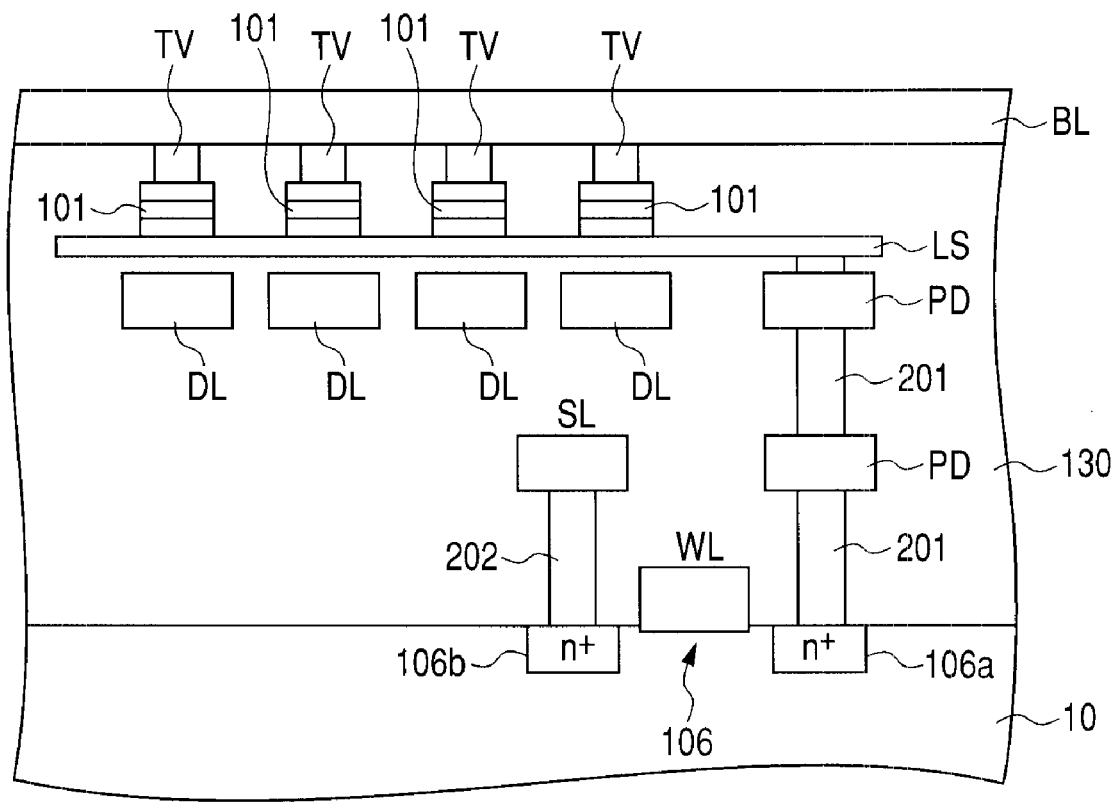
FIG. 31 is a schematic sectional view illustrating the configuration of a 1Tr-4TMR cell.
Figure 32:
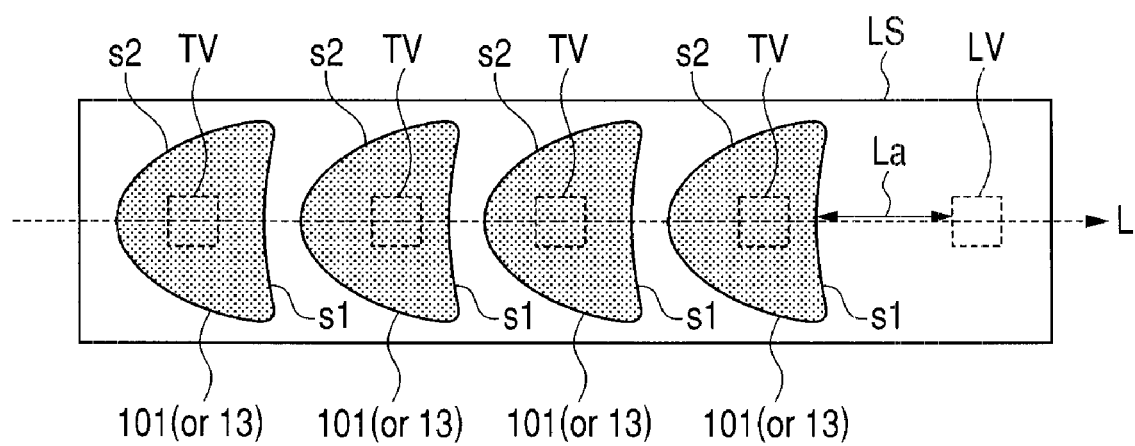
FIG. 32 is a plan view illustrating the arrangement relation between a local via and TMR elements in a fifth embodiment.

In this embodiment, TMR elements 101 and an element selection transistor 106 are arranged as illustrated in FIG. 31 in a semiconductor device. Specifically, in this embodiment, as illustrated in FIG. 32, all the multiple TMR elements 101 are arranged alongside only on one side of the local via LV as viewed on a plane. FIG. 32 is a plan view of the strap wiring LS in FIG. 31. The circuit diagram of the 1Tr-4TMR cell is the same as in FIG. 26. The cross-sectional configuration in FIG. 31 is the same as the cross-sectional configuration in FIG. 27 except the layout of the element selection transistor 106 and the like in the interlayer insulating film 130 and the like in the horizontal direction in the drawing. A local via LV of stacked via structure that does not have a pad electrode PD may be adopted.

Hereafter, more specific description will be given to a structure in this embodiment with reference to the plan view in FIG. 32.

FIG. 32 illustrates the arrangement relation between four TMR elements 101 and one local via LV formed in a strap wiring LS.

Each of the entire TMR elements 101 (or at least the recording layers 13) illustrated in FIG. 32 has the asymmetric shape described in relation to the first embodiment (FIG. 4). The following description with reference to FIG. 32 is on the assumption that each of the entire TMR elements 101 has the asymmetric shape illustrated in FIG. 4. The asymmetric shape of the TMR element 101 has been described in detail in relation to the first embodiment. Therefore, the description of the shape of the TMR element 101 in this embodiment will be omitted.

In this embodiment, as illustrated in FIG. 32, four TMR elements 101 are formed over the top surface of a strap wiring LS. All the TMR elements 101 are arranged alongside on one side (left side of the drawing) of the local via LV coupled at the under surface of the strap wiring LS. A predetermined distance is provided between adjoining TMR elements 101. Therefore, only a short side of the strap wiring LS exists on the other side (right side of the drawing) of the local via LV.

As described in relation to the first embodiment with reference to FIG. 5, all the TMR elements 101 are arranged with the orientation described below. In every TMR element 101, as illustrated in FIG. 32, one contoured portion (arc) s1 having a concave outline thereof is opposed to the local via LV formation side. In other words, the other contoured portion (arc) s2 having a convex outline thereof is not opposed to the local via LV formation side.

In each TMR element 101, the barycenter (center of area) exists on the axis of symmetry L and is positioned closer to the arc s1 than to the arc s2. The center of area cited here refers to the center of mass of a predetermined plane when the mass is evenly distributed in the plane. In the configuration in FIG. 32, therefore, the following is implemented in every TMR element: the contoured portion (arc) s1 of the TMR element 101 on the side closer to the center of area of the TMR element 101 is opposed to the local via LV formation side.

The planar shape of the strap wiring LS is substantially rectangular. As mentioned above, the local via LV and the TMR elements 101 are arranged alongside in the direction of the length of the strap wiring LS as viewed on a plane.

The local via LV formed in the strap wiring LS and the TMR element 101 adjacent to the local via LV are arranged away from each other by a predetermined distance La as viewed on a plane. The adjoining TMR elements 101 are arranged away from each other by a distance Lb different from the distance La. In the configuration illustrated in FIG. 32, the axes of symmetry L of the individual TMR elements 101 are coaxially arranged. The local via LV is placed over the extended line of the axes of symmetry L.

In this embodiment, as mentioned above, all the TMR elements 101 having the asymmetric shape illustrated in FIG. 4 are arranged over the strap wiring LS so that the arcs s1 thereof are opposed to the local via LV. (Refer to FIG. 32.) In other words, the following is implemented in every TMR element 101: the contoured portion (arc) s1 of the TMR element 101 on the side closer to the barycenter (center of area) of the TMR element 101 is opposed to the local via LV formation side. (Refer to FIG. 32.)

As described with reference to FIGS. 29 and 30, therefore, the occupied area of the strap wiring LS can be reduced. That is, the occupied area of the strap wiring LS can be reduced more in the disposition illustrated in FIG. 32 than in the following cases: cases where any one TMR element 101 is placed over the strap wiring LS so that the other contoured portion s2 thereof is opposed to the local via LV formation side.

As mentioned above, a sufficient distance La is allowed between the TMR elements 101 and the local via LV over the strap wiring LS. Therefore, it is possible to suppress the influence of a depressed portion, produced over the strap wiring LS due to the formation of the local via LV, on each TMR element 101. Thus it is possible to suppress variation in the write characteristic of the TMR elements 101 due to the influence of the depressed portion.

In this embodiment, no TMR element 101 is formed on the other side (right side in FIG. 32) of the local via LV. Therefore, it is unnecessary to provide a sufficient distance La for the suppression of degradation in the write characteristic of the TMR elements 101 on the other side. As a result, the occupied area of the strap wiring LS can be reduced more in this embodiment than in the fourth embodiment.

In the above embodiments, the planar shape of the strap wiring LS is substantially rectangular. As described in relation to the first embodiment as well, however, the following measure may be taken: the corner portions of the strap wiring LS facing the other contoured portion (arc) s2 of TMR elements 101 may be formed along the shape of the other contoured portions s2. (Refer to reference alphanumerals c1 and c2 in FIG. 14.)

As described in relation to the first embodiment as well, it is desirable that the following distance should be 0.1 μm or above: the distance between the other contoured portion s2 of a TMR element 101 facing an end edge portion of the strap wiring LS and the end edge portion. (Refer to FIG. 15.) It is more desirable that the width of the strap wiring area positioned between the other contoured portion s2 and the end edge portion should be constant regardless of place. (Refer to reference alphanumeral A1 in FIG. 15.)

In this embodiment, four TMR elements 101 are arranged over one strap wiring LS. However, the number of TMR elements arranged over one strap wiring LS only has to be equal to or larger than two. That is, the disposition method in this embodiment is applicable to 1Tr-nTMR cell structures (n: positive number not less than 2). Also in case of the 1Tr-nTMR cell structure, however, the arcs s1 of all the n TMR elements 101 are opposed to the local via LV.

In the description of this embodiment, a case where multiple TMR elements 101 (or recording layers 13) having the asymmetric shape described in relation to the first embodiment are arranged over one strap wiring LS has been taken as an example. However, the asymmetric shape of each TMR element 101 may be the shape described in relation to the second embodiment (FIG. 16) or the shape described in relation to the third embodiment (FIG. 21).

When the multiple TMR elements 101 are in the shape illustrated in FIG. 16, every TMR element 101 is arranged over the strap wiring LS so that the straight portion 804 thereof is opposed to the local via LV. (Refer to FIG. 17.) When the multiple TMR elements 101 are in the shape illustrated in FIG. 21, every TMR element 101 is arranged over the strap wiring LS so that the arc 850 side thereof having the first curvature is opposed to the local via LV. (Refer to FIG. 22.) Also in these cases, as illustrated in FIG. 32, the TMR elements 101 are arranged only on one side of the local via LV as viewed on a plane.

When the multiple TMR elements 101 are in the shape illustrated in FIG. 16 as mentioned above, the shape illustrated in FIG. 19 can be adopted for the shape of the corner portions of the strap wiring LS. Further, the configuration illustrated in FIG. 20 can also be adopted for the shape of the end edge portions of the strap wiring LS. When the multiple TMR elements 101 are in the shape illustrated in FIG. 21, the shape illustrated in FIG. 24 can be adopted for the shape of the corner portions of the strap wiring LS. Further, the configuration illustrated in FIG. 25 can also be adopted for the shape of the end edge portions of the strap wiring LS.

Figure 33:
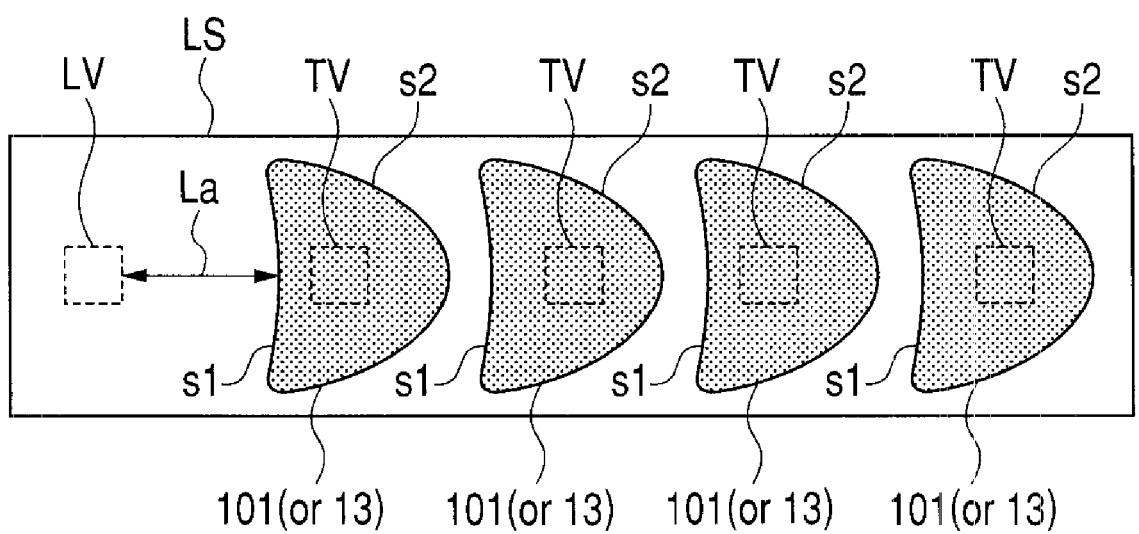
FIG. 33 is a plan view illustrating another arrangement relation between a local via and TMR elements in the fifth embodiment.

When the arcs s1 of all the TMR elements 101 are opposed to the local via LV, the disposition in FIG. 33 can also be adopted as a matter of course. That is, the TMR elements 101 may be all arranged only on one side of the local via LV or the TMR elements may be all arranged only on the other side of the local via LV opposite the one side.

The MRAMs described based on the above embodiments are applied to MCU (Memory Control Unit) products combined with nonvolatile memory, SOC (System On a Chip) products in which various elements are combined on a single chip, and the like.

What is claimed is:

1. A magnetic memory device comprising:
   a strap wiring;
   a contact via electrically coupling together the strap wiring and portions positioned under the strap wiring; and
   a magnetic recording element arranged at a distance from the formation position of the contact via as viewed on a plane and formed over the strap wiring,
   wherein the magnetic recording element includes:
   a fixed layer whose direction of magnetization is fixed; and
   a recording layer which is formed over the fixed layer and whose direction of magnetization is changed by an external magnetic field,
   wherein the planar shape of the recording layer is asymmetric with respect to the direction of the easy magnetization axis of the recording layer and is symmetric with respect to the axis of symmetry perpendicular to the easy magnetization axis, and
   wherein the contoured portion of the recording layer on the side closer to the center of area of the recording layer is opposed to the contact via side.

2. The magnetic memory device according to claim 1,
   wherein the planar shape of the strap wiring is substantially rectangular, and wherein the contact via and the magnetic recording element are arranged alongside in the direction of the length of the strap wiring as viewed on a plane.

3. The magnetic memory device according to claim 2, wherein the corner portions of the strap wiring facing the other contoured portion is formed along the shape of the other contoured portion.

4. The magnetic memory device according to claim 3, wherein the distance between the other contoured portion facing an end edge portion of the strap wiring and the end edge portion of the strap wiring is 0.1 μm or above.

5. The magnetic memory device according to claim 4, wherein the width of the strap wiring area positioned between the other contoured portion facing the end edge portion of the strap wiring and the end edge portion of the strap wiring is constant.

6. The magnetic memory device according to claim 2, wherein there are a plurality of the magnetic recording elements,
wherein the magnetic recording elements of a first number which is not less than 1 are arranged alongside on the first side of the contact via with a predetermined distance allowed between the magnetic recording elements adjoining to each other, and
wherein the magnetic recording elements of a second number which is not less than 1 are arranged alongside on the second side of the contact via opposite the first side with a predetermined distance allowed between the magnetic recording elements adjoining to each other.

7. The magnetic memory device according to claim 2, wherein there are a plurality of the magnetic recording elements, and
wherein all the magnetic recording elements are arranged alongside on one side of the contact via with a predetermined distance allowed between the magnetic recording elements adjoining to each other.

8. A magnetic memory device comprising:
a strap wiring;
a contact via electrically coupling together the strap wiring and portions positioned under the strap wiring; and
a magnetic recording element arranged at a distance from the formation position of the contact via as viewed on a plane and formed over the strap wiring,
wherein the magnetic recording element includes:
a fixed layer whose direction of magnetization is fixed; and
a recording layer which is formed over the fixed layer and whose direction of magnetization is changed by an external magnetic field,
wherein the planar shape of the recording layer is asymmetric with respect to the direction of the easy magnetization axis of the recording layer and is symmetric with respect to the axis of symmetry perpendicular to the easy magnetization axis,
wherein one contoured portion of the recording layer opposed to the easy magnetization axis has a concave outline and the other contoured portion of the recording layer opposed to the easy magnetization axis has a convex outline, and
wherein the one contoured portion faces the contact via side.

9. The magnetic memory device according to claim 8, wherein the contact via is placed on the extended line of the axis of symmetry as viewed on a plane.

10. The magnetic memory device according to claim 8, wherein the planar shape of the strap wiring is substantially rectangular, and
wherein the contact via and the magnetic recording element are arranged alongside in the direction of the length of the strap wiring as viewed on a plane.

11. The magnetic memory device according to claim 10, wherein the corner portions of the strap wiring facing the other contoured portion is formed along the shape of the other contoured portion.

12. The magnetic memory device according to claim 11, wherein the distance between the other contoured portion facing an end edge portion of the strap wiring and the end edge portion of the strap wiring is 0.1 μm or above.

13. The magnetic memory device according to claim 12, wherein the width of the strap wiring area positioned between the other contoured portion facing the end edge portion of the strap wiring and the end edge portion of the strap wiring is constant.

14. The magnetic memory device according to claim 10, wherein there are a plurality of the magnetic recording elements,
wherein the magnetic recording elements of a first number which is not less than 1 are arranged alongside on the first side of the contact via with a predetermined distance allowed between the magnetic recording elements adjoining to each other, and
wherein the magnetic recording elements of a second number which is not less than 1 are arranged alongside on the second side of the contact via opposite the first side with a predetermined distance allowed between the magnetic recording elements adjoining to each other.

15. The magnetic memory device according to claim 10, wherein there are a plurality of the magnetic recording elements, and
wherein all the magnetic recording elements are arranged alongside on one side of the contact via with a predetermined distance allowed between the magnetic recording elements adjoining to each other.

16. A magnetic memory device comprising:
a strap wiring;
a contact via electrically coupling together the strap wiring and portions positioned under the strap wiring; and
a magnetic recording element arranged at a distance form the formation position of the contact via as viewed on a plane and formed over the strap wiring,
wherein the magnetic recording element includes:
a fixed layer whose direction of magnetization is fixed; and
a recording layer which is formed over the fixed layer and whose direction of magnetization is changed by an external magnetic field,
wherein the planar shape of the recording layer is asymmetric with respect to the direction of the easy magnetization axis of the recording layer and is symmetric with respect to the axis of symmetry perpendicular to the easy magnetization axis,
wherein one contoured portion of the recording layer opposed to the easy magnetization axis is in a linear shape and the other contoured portion of the recording layer opposed to the easy magnetization axis has a convex outline, and
wherein the one contoured portion faces the contact via.

17. The magnetic memory device according to claim 16, wherein the planar shape of the strap wiring is substantially rectangular, and
wherein the contact via and the magnetic recording element are arranged alongside in the direction of the length of the strap wiring as viewed on a plane.

18. The magnetic memory device according to claim 17,
wherein the corner portions of the strap wiring facing the other contoured portion is formed along the shape of the other contoured portion.

19. The magnetic memory device according to claim 18,
wherein the distance between the other contoured portion facing an end edge portion of the strap wiring and the end edge portion of the strap wiring is 0.1 μm or above.

20. The magnetic memory device according to claim 19,
wherein the width of the strap wiring area positioned between the other contoured portion facing the end edge portion of the strap wiring and the end edge portion of the strap wiring is constant.

21. The magnetic memory device according to claim 17,
wherein there are a plurality of the magnetic recording elements,
wherein the magnetic recording elements of a first number which is not less than 1 are arranged alongside on the first side of the contact via with a predetermined distance allowed between the magnetic recording elements adjoining to each other, and
wherein the magnetic recording elements of a second number which is not less than 1 are arranged alongside on the second side of the contact via opposite the first side with a predetermined distance allowed between the magnetic recording elements adjoining to each other.

22. The magnetic memory device according to claim 17,
wherein there are a plurality of the magnetic recording elements, and
wherein all the magnetic recording elements are arranged alongside on one side of the contact via with a predetermined distance allowed between the magnetic recording elements adjoining to each other.

23. A magnetic memory device comprising:
a strap wiring;
a contact via electrically coupling together the strap wiring and portions positioned under the strap wiring; and
a magnetic recording element arranged at a distance from the formation position of the contact via as viewed on a plane and formed over the strap wiring,
wherein the magnetic recording element includes:
a fixed layer whose direction of magnetization is fixed; and
a recording layer which is formed over the fixed layer and whose direction of magnetization is changed by an external magnetic field,
wherein the planar shape of the recording layer is asymmetric with respect to the direction of the easy magnetization axis of the recording layer and is symmetric with respect to the axis of symmetry perpendicular to the easy magnetization axis,
wherein one contoured portion of the recording layer opposed to the easy magnetization axis has a convex outline having a first curvature and the other contoured portion of the recording layer opposed to the easy magnetization axis has a convex outline having a second curvature larger than the first curvature, and
wherein the one contoured portion faces the contact via side.

24. The magnetic memory device according to claim 23,
wherein the planar shape of the strap wiring is substantially rectangular, and
wherein the contact via and the magnetic recording element are arranged alongside in the direction of the length of the strap wiring as viewed on a plane.

25. The magnetic memory device according to claim 24,
wherein the corner portions of the strap wiring facing the other contoured portion is formed along the shape of the other contoured portion.

26. The magnetic memory device according to claim 25,
wherein the distance between the other contoured portion facing an end edge portion of the strap wiring and the end edge portion of the strap wiring is 0.1 μm or above.

27. The magnetic memory device according to claim 26,
wherein the width of the strap wiring area positioned between the other contoured portion facing the end edge portion of the strap wiring and the end edge portion of the strap wiring is constant.

28. The magnetic memory device according to claim 24,
wherein there are a plurality of the magnetic recording elements,
wherein the magnetic recording elements of a first number which is not less than 1 are arranged alongside on the first side of the contact via with a predetermined distance allowed between the magnetic recording elements adjoining to each other, and
wherein the magnetic recording elements of a second number which is not less than 1 are arranged alongside on the second side of the contact via opposite the first side with a predetermined distance allowed between the magnetic recording elements adjoining to each other.

29. The magnetic memory device according to claim 24,
wherein there are a plurality of the magnetic recording elements, and
wherein all the magnetic recording elements are arranged alongside on one side of the contact via with a predetermined distance allowed between the magnetic recording elements adjoining to each other.

* * * * *